(12) United States Patent
Kimura

(10) Patent No.: US 8,482,341 B2
(45) Date of Patent: Jul. 9, 2013

(54) BOOSTER CIRCUIT, SEMICONDUCTOR DEVICE, AND ELECTRONIC APPARATUS

(75) Inventor: Hajime Kimura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/469,713

(22) Filed: May 11, 2012

(65) Prior Publication Data

US 2012/0273810 A1 Nov. 1, 2012

Related U.S. Application Data

(60) Continuation of application No. 13/029,330, filed on Feb. 17, 2011, now Pat. No. 8,179,191, which is a continuation of application No. 12/783,677, filed on May 20, 2010, now Pat. No. 7,893,753, which is a continuation of application No. 12/236,629, filed on Sep. 24, 2008, now Pat. No. 7,724,074, which is a continuation of application No. 11/829,319, filed on Jul. 27, 2007, now Pat. No. 7,432,757, which is a division of application No. 11/074,128, filed on Mar. 7, 2005, now Pat. No. 7,256,642.

(30) Foreign Application Priority Data

Mar. 19, 2004 (JP) .................................. 2004-080124

(51) Int. Cl.
*G05F 1/10* (2006.01)
*G05F 3/02* (2006.01)

(52) U.S. Cl.
USPC ............................. 327/537; 327/536; 327/589

(58) Field of Classification Search
USPC .......................... 327/534–540, 589, 530, 390
See application file for complete search history.

(56) References Cited

U.S. PATENT DOCUMENTS

| | | | |
|---|---|---|---|
| 5,097,226 A | 3/1992 | Pascucci et al. | |
| 5,140,182 A | 8/1992 | Ichimura | |
| 5,774,405 A | 6/1998 | Tomishima | |
| 5,909,141 A | 6/1999 | Tomishima | |
| 5,926,059 A | 7/1999 | Brani et al. | |
| 6,151,229 A | 11/2000 | Taub et al. | |
| 6,154,088 A | 11/2000 | Chevallier et al. | |
| 6,157,242 A | 12/2000 | Fukui | |
| 6,307,425 B1 | 10/2001 | Chevallier et al. | |
| 6,448,842 B2 | 9/2002 | Zanuccoli et al. | |
| 6,603,346 B2 * | 8/2003 | Sawada et al. | 327/536 |

(Continued)

FOREIGN PATENT DOCUMENTS

| | | |
|---|---|---|
| EP | 0 403 823 A1 | 12/1990 |
| JP | 3-15266 | 1/1991 |
| JP | 7-79561 | 3/1995 |

*Primary Examiner* — Dinh T. Le
(74) *Attorney, Agent, or Firm* — Husch Blackwell LLP

(57) ABSTRACT

The invention provides a booster circuit including a first transistor, a second transistor, a first capacitor element, a second capacitor element, a diode, and an inverter, wherein one electrode of the first transistor is maintained at a predetermined potential, the output of the inverter is connected to the gate electrode of the first transistor and one electrode of the second transistor through the second capacitor element, the input of the inverter is connected to the other electrode of the first transistor through the first capacitor element and connected to the gate electrode of the second transistor, and the diode is connected between the other electrode of the first transistor and the other electrode of the second transistor so as to be forwardly biased.

16 Claims, 46 Drawing Sheets

U.S. PATENT DOCUMENTS

| | | |
|---|---|---|
| 6,650,569 B2 | 11/2003 | Angelica et al. |
| 6,674,317 B1 | 1/2004 | Chou |
| 6,707,335 B2 | 3/2004 | Kawai et al. |
| 7,061,306 B2 | 6/2006 | Nazarian et al. |
| 7,102,422 B1 * | 9/2006 | Sawada et al. ............... 327/536 |
| 7,446,596 B1 | 11/2008 | Fort et al. |
| 7,893,753 B2 * | 2/2011 | Kimura ...................... 327/537 |
| 7,969,234 B2 | 6/2011 | Jung |
| 8,212,801 B2 * | 7/2012 | Miyazawa et al. ............ 345/211 |
| 2003/0160745 A1 | 8/2003 | Osame et al. |

* cited by examiner

BOOSTER CIRCUIT, SEMICONDUCTOR DEVICE, AND ELECTRONIC APPARATUS

This application is a continuation of U.S. application Ser. No. 13/029,330, filed on Feb. 17, 2011 which is a continuation of U.S. application Ser. No. 12/783,677, filed on May 20, 2010 (now U.S. Pat. No. 7,893,753 issued Feb. 22, 2011) which is a continuation of U.S. application Ser. No. 12/236,629, filed on Sep. 24, 2008 (now U.S. Pat. No. 7,724,074 issued May 25, 2010) which is a continuation of U.S. application Ser. No. 11/829,319, filed on Jul. 27, 2007 (now U.S. Pat. No. 7,432,757 issued Oct. 7, 2008) which is a divisional of U.S. application Ser. No. 11/074,128, filed on Mar. 7, 2005 (now U.S. Pat. No. 7,256,642 issued Aug. 14, 2007).

BACKGROUND OF THE INVENTION

1. Field of the Invention

The present invention relates to a booster circuit having a new configuration, and more particularly, the invention relates to a semiconductor device using a charge pump as a booster circuit. Also, the invention relates to an electronic apparatus having the semiconductor device.

2. Description of the Related Art

The booster circuit is classified into the one with a coil and the one with a capacitor element. The latter one with a capacitor element is generally called a charge pump. A conventional charge pimp comprises: a first boosting block including a booster circuit for generating a voltage higher than an external power supply voltage, a diode that is connected to an output of the booster circuit, maintains the output voltage of the booster circuit at a predetermined level, and has a zener voltage higher than the external power supply voltage, and a voltage dividing resistor element for generating a reference voltage of a predetermined level in accordance with the voltage maintained at a predetermined level by the diode; and a second boosting block that generates and outputs a voltage of which the output level is controlled to be a predetermined level in accordance with the reference voltage generated by the first boosting block, has a higher output current capacity than the first boosting block, and does not operate in a standby mode (see Patent Document 1).

[Patent Document 1] Japanese Patent Laid-Open No. 7-79561

In the circuit disclosed in Patent Document 1, which requires a booster circuit for generating a voltage higher than an external power supply voltage, low power consumption is difficult to be achieved.

In addition, a display device incorporating the aforementioned conventional switching element for charge pump has the following problem. The charge pump, unlike other switching regulators, generally does not have a function to feed back an output voltage to stabilize the output, leading to a heavier current load and an unstable power supply with a higher output current.

SUMMARY OF THE INVENTION

The invention provides a charge pump having a different configuration than the one disclosed in Patent Document 1, and a semiconductor device using the charge pump.

In view of the foregoing, the invention provides a booster circuit having the following configurations.

A booster circuit of the invention is characterized by comprising a first transistor, a second transistor, a first capacitor element, a second capacitor element, a diode, and an inverter, wherein one electrode of the first transistor is maintained at a predetermined potential, the output of the inverter is connected to the gate electrode of the first transistor and one electrode (first electrode) of the second transistor through the second capacitor element, the input of the inverter is connected to the other electrode of the first transistor through the first capacitor element and connected to the gate electrode of the second transistor, and the diode is connected between the other electrode (second electrode) of the first transistor and the other electrode of the second transistor so as to be forwardly biased.

A booster circuit of the invention having another configuration is characterized by comprising a first transistor, a second transistor, a first capacitor element, a second capacitor element, a diode, and an inverter, wherein one electrode of the first transistor is maintained at a predetermined potential, the output of the inverter is connected to the gate electrode of the first transistor and one electrode of the second transistor through the second capacitor element, the input of the inverter is connected to the other electrode of the first transistor through the first capacitor element and connected to the gate electrode of the second transistor, and the diode is connected to the other electrode of the first transistor so as to be forwardly biased.

The booster circuit having the aforementioned configuration is characterized in that the first transistor and the second transistor have N-type conductivity and the predetermined potential is a high level potential, or the first transistor and the second transistor have P-type conductivity and the predetermined potential is a low level potential.

A booster circuit of the invention having another configuration is characterized by comprising a first transistor, a second transistor, a third transistor, a capacitor element, a diode, and an inverter, wherein one electrode of the first transistor and the gate electrode of the second transistor are maintained at a predetermined potential, the output of the inverter is connected to the gate electrode of the third transistor, one electrode of the third transistor is connected to the gate electrode of the first transistor and one electrode of the second transistor, the other electrode of the first transistor is connected to the other electrode of the second transistor, and the diode is connected to the other electrode of the first transistor so as to be forwardly biased.

The booster circuit having the aforementioned configuration is characterized in that the first transistor and the second transistor have P-type conductivity whereas the third transistor has N-type conductivity and the predetermined potential is a high level potential, or the first transistor and the second transistor have N-type conductivity whereas the third transistor has P-type conductivity and the predetermined potential is a low level potential.

A booster circuit of the invention having another configuration is characterized by comprising a first transistor, a second transistor, a first capacitor element, a second capacitor element, a diode, and an inverter, wherein one electrode of the first transistor is maintained at a predetermined potential, the output of the inverter is connected to the gate electrode of the second transistor and the other electrode of the first transistor through the second capacitor element, the input of the inverter is connected to the gate electrode of the first transistor and one electrode of the second transistor through the first capacitor element, and the diode is connected to the gate electrode of the first transistor so as to be forwardly biased.

A booster circuit of the invention having another configuration is characterized by comprising a first transistor, a second transistor, a first capacitor element, a second capacitor element, a diode, and an inverter, wherein the diode is connected to the first capacitor element and one electrode of the first transistor so as to be forwardly biased and maintained at a predetermined potential, the output of the inverter is connected to the gate electrode of the second transistor and the other electrode of the first transistor through the second capacitor element, and the input of the inverter is connected to the one electrode of the first transistor through the gate electrode of the first transistor and the first capacitor element.

A booster circuit of the invention having another configuration is characterized by comprising a first transistor, a second transistor, a first capacitor element, a second capacitor element, a diode, and an inverter, wherein the diode is connected to the first capacitor element and one electrode of the second transistor and maintained at a predetermined potential, the output of the inverter is connected to the gate electrode of the second transistor and one electrode of the transistor through the second capacitor element, the input of the inverter is connected to the gate electrode of the first transistor and connected to the one electrode of the second transistor through the first capacitor element.

A booster circuit of the invention having another configuration is characterized by comprising a first transistor, a second transistor, a third transistor, a first capacitor element, a second capacitor element, and a diode, wherein the diode is connected to the first capacitor element, the gate electrode of the first transistor and one electrode of the second transistor and maintained at a predetermined potential, the gate electrode of the first transistor and the one electrode of the second transistor are connected to the gate electrode of the third transistor through the first capacitor element, one electrode of the first transistor is connected to the other electrode of the second transistor, and the other electrode of the first transistor is connected to one electrode of the third transistor.

The booster circuit having the aforementioned configuration is characterized in that a clock signal is inputted to the gate electrode of the third transistor.

The booster circuit having the aforementioned configuration is characterized in that the first transistor has N-type conductivity whereas the second transistor has P-type conductivity and the predetermined potential is a high level potential, or the first transistor has P-type conductivity whereas the second transistor has N-type conductivity and the predetermined potential is a low level potential.

A booster circuit of the invention having another configuration is characterized by comprising a first transistor, a second transistor, a third transistor, a fourth transistor, a first capacitor element, a second capacitor element, a third capacitor element, and an inverter, wherein one electrode of the first transistor is maintained at a predetermined potential and connected to one electrode of the third transistor, the output of the inverter is connected to the gate electrode of the second transistor and connected to the gate electrode of the third transistor and one electrode of the fourth transistor through the first capacitor element, the input of the inverter is connected to the gate electrode of the first transistor and one electrode of the second transistor through the second capacitor element and connected to the gate electrode of the fourth transistor and the other electrode of the third transistor through the third capacitor element, the other electrode of the first transistor is connected to the gate electrode of the third transistor and the one electrode of the fourth transistor, and the other electrode of the second transistor is connected to the other electrode of the fourth transistor.

The booster circuit having the aforementioned configuration is characterized in that the first, second and third transistors have N-type conductivity whereas the fourth transistor has P-type conductivity and the predetermined potential is a high level potential, or the first, second and third transistors have P-type conductivity whereas the fourth transistor has N-type conductivity and the predetermined potential is a low level potential.

The booster circuit having the aforementioned configuration is characterized in that a clock signal is inputted to the inverter.

In the aforementioned booster circuit of the invention, a thin film transistor (hereinafter also referred to as a TFT) can be used as a transistor.

According to the invention, a booster circuit having a new configuration can be provided. As a result, low power consumption, high output current and high output potential can be achieved.

Since the charge pump of the invention can be constituted by thin film transistors, it can be formed integrally with a pixel portion of a liquid crystal display device, a display device having light emitting elements (hereinafter also referred to as a light emitting device), and other display devices. Accordingly, the clock frequency of a switching element using the charge pump can be selected depending on a display mode, resulting in lower power consumption of the display device. Further, the integral formation allows the external circuit to be simplified. Thus, the number of components of the circuit can be reduced and reduction in cost can be achieved.

DETAILED DESCRIPTION OF THE INVENTION

Figure 1A:
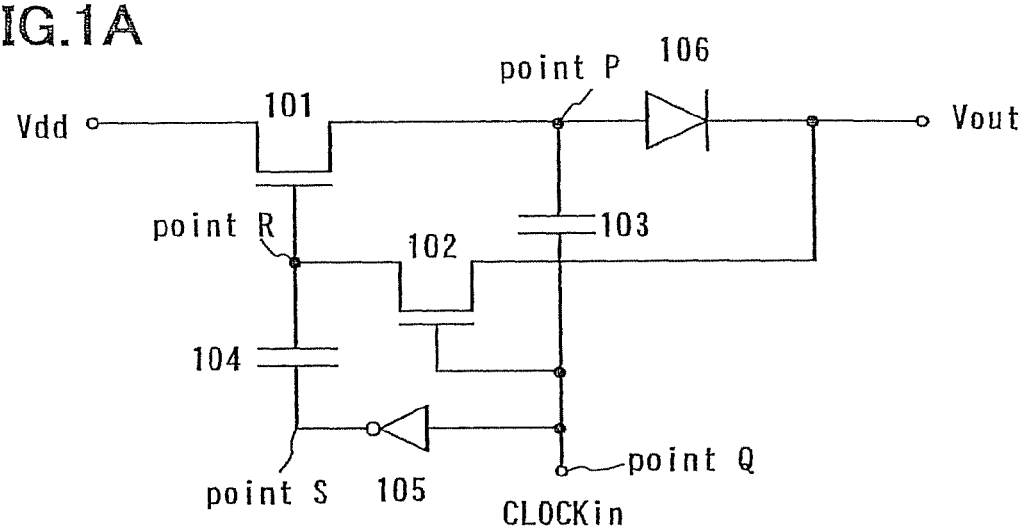
FIGS. 1A and 1B are circuit diagrams each showing a charge pump of the invention.

Although the invention will be described by way of Embodiment Modes with reference to the accompanying drawings, it is to be understood that various changes and modifications will be apparent to those skilled in the art. Therefore, unless such changes and modifications depart from the scope of the invention, they should be construed as being included therein.

The identical portions or portions having the same function are denoted by the same reference numerals in all the drawings for describing Embodiment Modes, and will be described in no more detail.

Although a transistor has three terminals of gate, source and drain terminals, there is no clear structural distinction between the source electrode terminal (source electrode) and the drain electrode terminal (drain electrode). Therefore, in the description of the connection between elements, one of the source electrode and the drain electrode is referred to as one electrode while the other thereof is referred to as the other electrode.

[Embodiment Mode 1]

Figure 13:
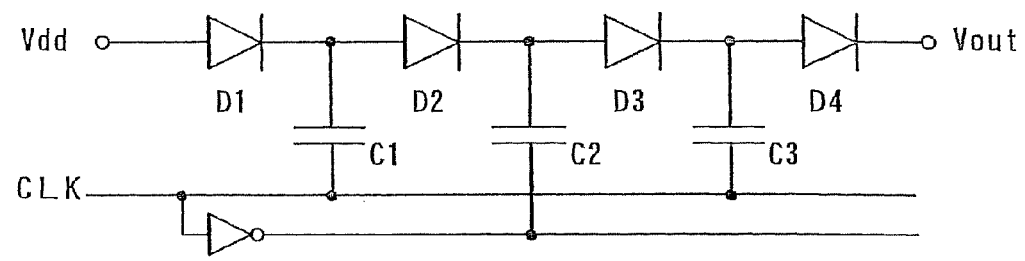
FIG. 13 is a circuit diagram showing a charge pump.

In this embodiment mode, configuration and operation of the charge pump are described. Note that a plural-stage charge pump can multiply a voltage. In a four-stage Dickson charge pump as shown in FIG. 13, an output voltage can be ideally boosted up to four times. Described in this embodiment mode is a circuit configuration that can be used for the first stage of the circuit.

A charge pump shown in FIG. 1A includes a first transistor 101, a second transistor 102, a first capacitor element 103, a second capacitor element 104, an inverter 105, and a diode 106. The capacitor element 103 in FIG. 1A corresponds to a capacitor element C1 in FIG. 13. The diode 106 has a function corresponding to a diode D2 in FIG. 13. The first transistor 101, the second transistor 102 and the capacitor element 104 collectively function as a diode D1 in FIG. 13.

It is assumed that a high level potential is Vdd and a low level potential is 0 V for simplicity, though the invention is not limited to this. Accordingly, Vdd and 0 V are inputted to the inverter 105 as a high signal and a low signal, respectively. Also, Vdd and 0 V are outputted from the inverter 105 as a high signal and a low signal, respectively. In this embodiment mode, the first transistor 101 and the second transistor 102 have N-type conductivity. The diode 106 may be any one of a PN diode, a PIN diode, a Schottky diode, and a diode connected transistor. In the case of a diode connected transistor being used, it may have either N-type conductivity or P-type conductivity. The diode 106 may also have any element configuration and circuit configuration. For example, circuit configurations described in Embodiment Modes 4 to 7 below may be adopted for the diode 106. The first transistor 101, the second transistor 102 and the capacitor element 104 collectively function as a diode D1 in FIG. 13.

The connection between each element is described now.

One electrode of the first transistor 101 is connected to a power supply to be maintained at a high level potential of Vdd. The output of the inverter 105 (point S) is connected to the gate electrode of the first transistor 101 and one electrode of the second transistor 102 (point R) through the second capacitor element 104. The input of the inverter 105 (point Q) is connected to the other electrode of the first transistor 101 and the input of the diode 106 (point P) through the first capacitor element 103 and connected to the gate electrode of the second transistor 102. The other electrode of the second transistor 102 is connected to the output of the diode 106. That is, the diode 106 is connected between the other electrode of the first transistor 101 and the other electrode of the second transistor 102 so as to be forwardly biased.

The operation of the charge pump having such a circuit configuration is described below.

A clock signal with a high signal of Vdd and a low signal of 0 V is inputted to the input of the inverter 105 (point Q). If a low signal is inputted to the input of the inverter 105 (point Q), for example, a high signal is inputted to the second capacitor element 104 while a low signal is inputted to the gate electrode of the second transistor 102 and the first capacitor element 103. At this time, the other electrode of the first transistor 101 (point P) is at 0 V and the gate electrode thereof is at Vdd. Thus, the first transistor 101 of which the gate electrode is applied with a high voltage is turned on. Since the first transistor 101 is turned on, the potential at the point P rises, thereby a predetermined charge is accumulated in the first capacitor element 103. The second transistor 102 of which the gate electrode is at 0 V is turned off. Accordingly, the voltage at both ends of the second capacitor element 104 can be held.

When the next clock waveform, namely a high signal is inputted to the point Q, a high signal is inputted to the gate electrode of the second transistor 102 and the first capacitor element 103, while a low signal is inputted to the second capacitor element 104. Since a high signal is inputted to the first capacitor element 103, the voltage at the point P increases by Vdd corresponding to a high signal, leading to increase in Vout across the diode 106. The second transistor 102 of which the gate electrode is at Vdd is turned on. Thus, current flows from Vout to the point R. When the voltage between the point Q and the point R becomes equal to the threshold voltage (Vth) of the second transistor 102, the second transistor 102 is turned off. Accordingly, the voltage at the point R is lower than that at the point Q by Vth. In other words, the first transistor 101 of which the gate electrode is applied with a low potential is turned off, thus the charge accumulated in the first capacitor element 103 does not leak through the first transistor 101 and can be outputted to Vout certainly. As a result, the potential at the input of the diode 106 (point P) becomes higher than that at the output thereof (Vout), and a predetermined current can be outputted to Vout, thereby Vout is boosted. As the point S is at 0 V at this time, the voltage at both ends of the second capacitor element 104 is equal to Vdd−Vth.

When the next clock waveform, namely a low signal is inputted to the point Q, a high signal is inputted to the second capacitor element 104 while a low signal is inputted to the gate electrode of the second transistor 102 and the first capacitor element 103. As set forth above, the predetermined charge has already been accumulated in the second capacitor element 104, and the voltage at the point R is equal to Vdd−Vth. The point R is further added with Vdd corresponding to a high signal, thus the potential at the gate electrode of the first transistor 101 rises. Since the second transistor 102 is off at this time, the charge accumulated in the second capacitor element 104 is held and the potential at the point R rises by Vdd. Accordingly, the first transistor 101 is turned on as described above. The gate electrode of the first transistor 101 has a voltage higher than Vdd+Vth at this time, therefore, the potential at the point P is equal to Vdd. It is feared that the potential at the input of the diode 106 (point P) may be lower than that at the output thereof, however, no current flows in view of the characteristics of the diode. Thus, Vout can be maintained at a high level.

When the next clock wave form, namely a high signal is inputted to the point Q, as set forth above, a high signal is inputted to the gate electrode of the second transistor 102 and the first capacitor element 103, while a low signal is inputted to the second capacitor element 104. Then, a high signal is inputted to the first capacitor element 103, thereby the voltage at the point P increases by Vdd corresponding to a high signal, leading to increase in Vout across the diode 106. The second transistor 102 of which the gate electrode is at Vdd is turned on. Thus, current flows from Vout to the point R. When the voltage between the point Q and the point R becomes equal to the threshold voltage (Vth) of the second transistor 102, the second transistor 102 is turned off. Accordingly, the voltage at the point R is lower than that at the point Q by Vth. In other words, the first transistor 101 of which the gate electrode is applied with a low potential is turned off, thus the charge accumulated in the first capacitor element 103 does not leak through the first transistor 101 and can be outputted to Vout certainly. As a result, the potential at the input of the diode 106 (point P) becomes higher than that at the output thereof (Vout), and a predetermined current can be outputted to Vout, thereby Vout is boosted. As the point S is at 0 V at this time, the voltage at both ends of the second capacitor element 104 is equal to Vdd−Vth.

Figure 1B:
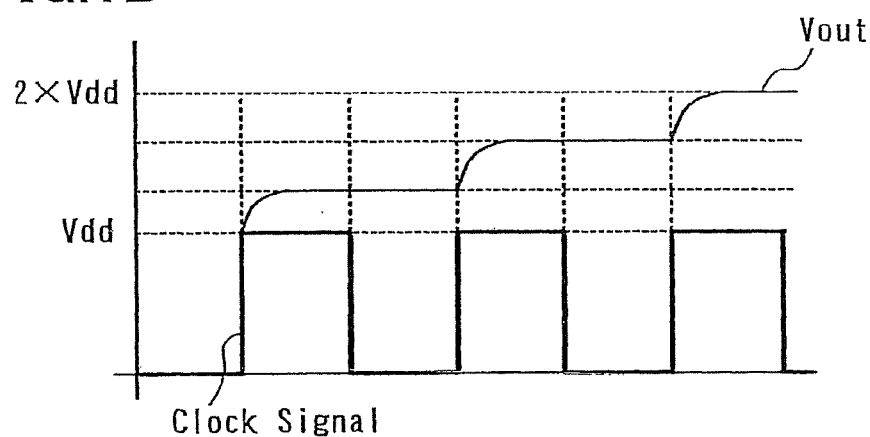

By repeating such operation, the potential at Vout can be increased to 2×Vdd (see FIG. 1B).

Note that the potential at Vout can be increased to 2×Vdd only when no load is connected to Vout. If a load (resistor, capacitor, transistor, circuit, or the like) is provided, which consumes current, the potential at Vout becomes lower than 2×Vdd.

In the charge pump according to this embodiment mode, the voltage at the gate electrode of the first transistor 101 can be made higher than Vdd+Vth by the second capacitor element 104. In other words, voltage drop due to the threshold voltage of the first transistor 101 can be prevented, namely, it can be prevented that the potential at Vout drops by Vth of the first transistor 101. When a high signal is inputted to the point Q, the voltage at the point R becomes equal to Vdd−Vth through the second transistor 102. At this time, charge leak can be prevented by turning the first transistor 101 off.

This embodiment mode is not limited to the connection shown in FIG. 1A. For example, the point S and the point Q are connected to each other through the inverter 105, though the invention is not limited to this.

Different signals may be supplied to the point Q and the point S instead of providing the inverter 105. In this case, inverted signals are desirably supplied to the point Q and the point S, though the invention is not limited to this. The signals supplied to the point Q and the point S are not necessarily inverted as long as the circuit operates normally.

A high signal inputted to the point Q is not necessarily equal to Vdd, and may have a voltage lower or higher than Vdd. Similarly, a low signal inputted to the point Q is not necessarily equal to 0 V, and may have a voltage lower or higher than 0 V.

A high signal inputted to the point S is not necessarily equal to Vdd, and may have a voltage lower or higher than Vdd. Similarly, a low signal inputted to the point S is not necessarily equal to 0 V, and may have a voltage lower or higher than 0 V.

Similarly, a high signal inputted to the point S and a high signal inputted to the point Q may have different potentials. Similarly, a low signal inputted to the point S and a low signal inputted to the point Q may have different potentials.

In the aforementioned charge pump, thin film transistors can be used as the transistors. As a result, the charge pump can be formed integrally with a display device or a nonvolatile memory such as a flash memory. When thin film transistors are used in the charge pump, however, it is difficult to raise the potential to a predetermined level because of a high threshold voltage. In addition, variations in threshold voltages of thin film transistors may cause variations in potentials to be outputted. Meanwhile, when the charge pump according to this embodiment mode is used, the second capacitor element 104 prevents voltage drop due to threshold voltage as described above. Therefore, the charge pump according to this embodiment mode is extremely effective in the case of using thin film transistors having a threshold voltage higher than transistors formed over a silicon wafer.

The charge pump including thin film transistors can be formed integrally with a liquid crystal display device, a light emitting device and other display devices.

In such a case, either or both of the first capacitor element 103 and the second capacitor element 104 may be formed integrally with the display device. The integral formation with the display device allows reduction in the number of components. On the other hand, if the capacitor element is not formed integrally with the display device, the capacitance of the capacitor element can be increased. The first capacitor element 103 is required to have higher capacitance than the second capacitor element 104. Thus, the smaller second capacitor element 104 may be formed integrally with the display device, thereby the number of components is reduced and cost reduction is achieved. Meanwhile, the larger first capacitor element 103 may be formed separately from the display device, thereby the capacitance of the first capacitor element 103 can be increased.

Although the first transistor 101 and the second transistor 102 have N-type conductivity in this embodiment mode, the conductivity of the transistors is not exclusively limited. For example, a circuit configuration where the first transistor 101 and the second transistor 102 have P-type conductivity and one electrode of the first transistor 101 is maintained at a low level potential (0 V in this embodiment mode) may be adopted as well. In this case, the direction of the diode 106 shown in FIG. 1A is desirably reversed. That is, in this embodiment mode, the conductivity of the transistor can be changed depending on whether one electrode of the first transistor 101 is maintained at a high level potential or a low level potential.

[Embodiment Mode 2]

Described in this embodiment mode are configuration and operation of the charge pump, which are different from those shown in Embodiment Mode 1. In this embodiment, a circuit configuration that can be used for the first stage is described as is in Embodiment Mode 1.

Figure 2:
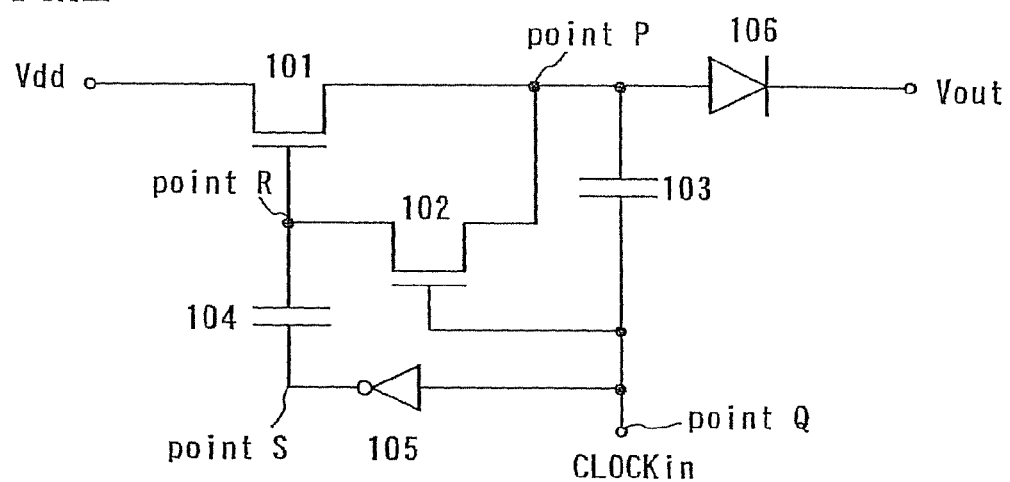
FIG. 2 is a circuit diagram showing a charge pump of the invention.

A charge pump shown in FIG. 2 includes, similarly to that shown in FIG. 1A, the first transistor 101, the second transistor 102, the first capacitor element 103, the second capacitor element 104, the inverter 105, and the diode 106. The first capacitor element 103 corresponds to the capacitor element C1 in FIG. 13. The diode 106 has a function corresponding to the diode D2 in FIG. 13. It is assumed that a high level potential is Vdd while a low level potential is 0 V for simplicity, though the invention is not limited to this. Accordingly, Vdd is outputted from the inverter 105 as a high signal while 0 V is outputted from the inverter 105 as a low signal. In this embodiment mode, the first transistor 101 and the second transistor 102 have N-type conductivity. The diode 106 may be any one of a PN diode, a PIN diode, a Schottky diode, and a diode connected transistor. The diode 106 may also have any element configuration and circuit configuration. For example, circuit configurations described in Embodiment Modes 4 to 7 may be adopted for the diode 106. The first transistor 101, the second transistor 102 and the capacitor element 104 collectively function as the diode D1 in FIG. 13.

The connection between each element is described now. The connection of the charge pump in FIG. 2 is similar to that shown in FIG. 1A except that the other electrode of the second transistor 102 is connected to the input of the diode 106 (point P).

The operation of the charge pump having such a circuit configuration is similar to that described in Embodiment Mode 1.

Similarly to Embodiment Mode 1, a voltage of 2×Vdd can be outputted to Vout by repeating the operation (see FIG. 1B).

In the charge pump according to this embodiment mode, voltage drop due to the threshold voltage of the first transistor 101 can be prevented by the second capacitor element 104. When a high signal is inputted to the point Q, the voltage at the point R becomes equal to Vdd−Vth through the second transistor 102. At this time, charge leak can be prevented by turning the first transistor 101 off.

As described in Embodiment Mode 1, this embodiment mode is not limited to the connection shown in FIG. 2.

In the aforementioned charge pump, thin film transistors can be used as the transistors. As a result, the charge pump can be formed integrally with a display device or a nonvolatile memory such as a flash memory. When thin film transistors are used in the charge pump, however, it is difficult to raise the potential to a predetermined level because of a high threshold voltage. In addition, variations in threshold voltages of thin film transistors may cause variations in potentials to be outputted. Meanwhile, when the charge pump according to this embodiment mode is used, the second capacitor element 104 prevents voltage drop due to threshold voltage as described above. Therefore, the charge pump according to this embodiment mode is extremely effective in the case of using thin film transistors having a threshold voltage higher than transistors formed on a silicon wafer.

The charge pump including thin film transistors can be formed integrally with a liquid crystal display device, a light emitting device and other display devices.

Although the first transistor 101 and the second transistor 102 have N-type conductivity in this embodiment mode, the conductivity of the transistors is not exclusively limited. For example, a circuit configuration where the first transistor 101 and the second transistor 102 have P-type conductivity and one electrode of the first transistor 101 is maintained at a low level potential (0 V in this embodiment mode) may be adopted as well. In this case, the direction of the diode 106 is desirably reversed to that shown in FIG. 2. That is, in this embodiment mode, the conductivity of the transistor can be changed depending on whether one electrode of the first transistor 101 is maintained at a high level potential or a low level potential.

[Embodiment Mode 3]

Described in this embodiment mode are configuration and operation of the charge pump, which are different from those shown in Embodiment Modes 1 and 2. In this embodiment mode, a circuit configuration that can be used for the first stage is described as is in Embodiment Modes 1 and 2.

Figure 3:
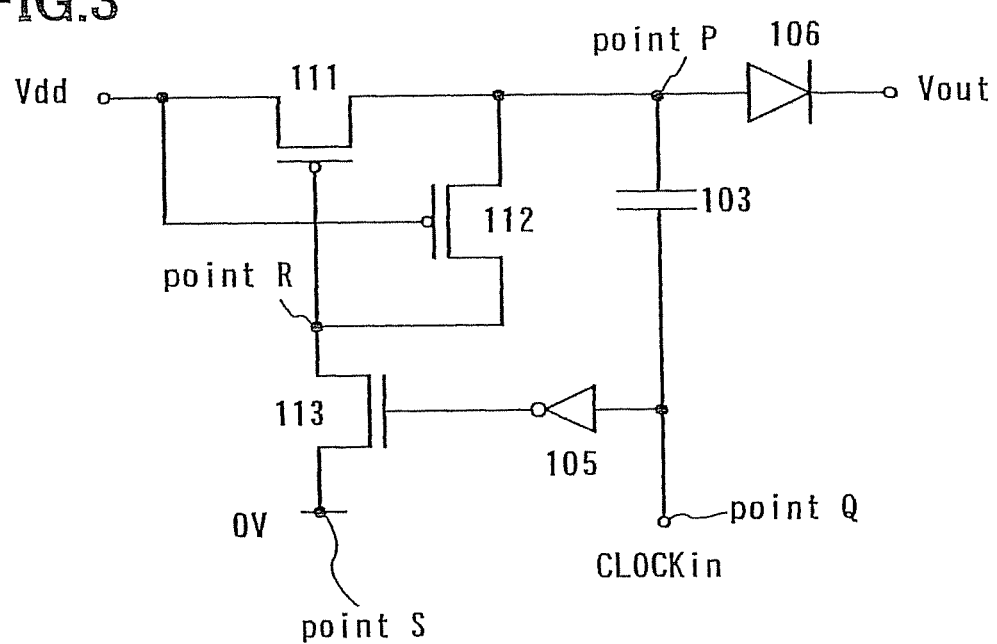
FIG. 3 is a circuit diagram showing a charge pump of the invention.

A charge pump shown in FIG. 3 includes a first transistor 111, a second transistor 112, a third transistor 113, the capacitor element 103, the inverter 105, and the diode 106. The capacitor element 103 in FIG. 3 corresponds to the capacitor element C1 in FIG. 13. The diode 106 has a function corresponding to the diode D2 in FIG. 13. It is assumed that a high level potential is Vdd while a low level potential is 0 V for simplicity, though the invention is not limited to this. Accordingly, Vdd is outputted from the inverter 105 as a high signal while 0 V is outputted from the inverter 105 as a low signal. In this embodiment mode, the first transistor 111 and the second transistor 112 have P-type conductivity and the third transistor 113 has N-type conductivity. The diode 106 may be any one of a PN diode, a PIN diode, a Schottky diode, and a diode connected transistor. The diode 106 may also have any element configuration and circuit configuration. For example, circuit configurations described in Embodiment Modes 4 to 7 may be adopted for the diode 106. The first transistor 111, the second transistor 112 and the third transistor 113 collectively function as the diode D1 in FIG. 13.

The connection between each element is described below. One electrode of the first transistor 111 and the gate electrode of the second transistor 112 are connected to a power supply to be maintained at a high level potential of Vdd. The output of the inverter 105 is connected to the gate electrode of the third transistor 113. One electrode of the third transistor 113 is connected to the gate electrode of the first transistor 111 and one electrode of the second transistor 112 (point R). The other electrode of the first transistor 111 is connected to the other electrode of the second transistor 112. The input of the inverter 105 (point Q) is connected to the input of the diode 106 (point P) through the capacitor element 103. That is, the diode 106 is connected to the other electrode of the first transistor 111 so as to be forwardly biased.

The operation of the charge pump having such a circuit configuration is described A clock signal with a high signal of Vdd and a low signal of 0 V is inputted to the input of the inverter 105 (point Q). If a low signal is inputted to the input of the inverter 105 (point Q), for example, a high signal is inputted to the third transistor 113 while a low signal is inputted to the capacitor element 103. At this time, the third transistor 113 of which the other electrode (drain electrode) is at 0 V and the gate electrode is at Vdd is turned on. Thus, since the gate electrode of the first transistor 111 becomes 0 V and one electrode thereof is at Vdd, the first transistor 111 is turned on. Accordingly, the potential at the point P becomes Vdd, thereby a predetermined charge is accumulated in the capacitor element 103. The second transistor 112 of which one electrode (source electrode, point P) is at Vdd and the gate electrode is at Vdd is turned off at this time.

When the next clock waveform, namely a high signal is inputted to the point Q, a low signal is inputted to the third transistor 113 while a high signal is inputted to the capacitor element 103. Since a high signal is inputted to the capacitor element 103, Vdd corresponding to a high signal is added to the charge that has already been accumulated in the capacity element 103 and the voltage at the point P increases, leading to increase in Vout across the diode 106. The third transistor 113 of which the other electrode (source electrode, point R) is at 0 V and the gate electrode is at 0 V is turned off at this time. The other electrode of the second transistor 112 (source electrode, point P) becomes equal to the potential at one end of the capacitor element 103, namely 2×Vdd, and the gate electrode thereof is at Vdd, thus the second transistor 112 is turned on. The potential at the point R rises to the potential at the point P. Then, the potential at the gate electrode of the first transistor 111 (point R) becomes equal to that at the source electrode thereof (point P), thereby the first transistor 111 is turned off. As a result, the potential at the input of the diode 106 (point P) becomes higher than that at the output thereof, thus a predetermined voltage can be outputted to Vout. Since the first transistor 111 is off at this time, the charge accumulated in the capacitor element 103 does not flow to the first transistor 111 and can be outputted to Vout certainly.

The potential at Vout can be increased to 2×Vdd by repeating such operation.

The charge pump according to this embodiment mode is advantageous in that the voltage of 2×Vdd held in the capacitor element 103 is not lost since the second transistor 112 is on while the first transistor 111 is off when a predetermined voltage is outputted to Vout, namely when a high signal is inputted to the point Q. In addition, the charge pump according to this embodiment mode can make the point P be at the voltage of Vdd, since the voltage at the point R becomes 0 V and the first transistor 111 is turned on when a low signal is inputted to the point Q. That is, the voltage at the point P does not become Vdd−Vth. Therefore, a predetermined voltage can be outputted to Vout independently of the threshold voltage (Vth) of the first transistor 111. In other words, a predetermined charge can be accumulated without being affected by voltage drop due to the threshold voltage of the first transistor 111.

This embodiment mode is not limited to the connection shown in FIG. 3. For example, the point S may be connected to the point Q. Further, although the point Q and the gate electrode of the third transistor 113 are connected to each other though the inverter 105, the invention is not limited to this.

Different signals may be supplied to the point Q and the gate electrode of the third transistor 113 instead of providing the inverter 105. In this case, inverted signals are desirably supplied to the point Q and the gate electrode of the third transistor 113, though the invention is not limited to this. The signals supplied to the point Q and the gate electrode of the third transistor 113 are not necessarily inverted as long as the circuit operates normally.

A high signal inputted to the point Q is not necessarily equal to Vdd, and may have a voltage lower or higher than Vdd. Similarly, a low signal inputted to the point Q is not necessarily equal to 0 V, and may have a voltage lower or higher than 0 V.

A high signal inputted to the gate electrode of the third transistor 113 is not necessarily equal to Vdd, and may have a voltage lower or higher than Vdd. Similarly, a low signal inputted to the gate electrode of the third transistor 113 is not necessarily equal to 0 V, and may have a voltage lower or higher than 0 V.

A high signal inputted to the gate electrode of the third transistor 113 and a high signal inputted to the point Q may have different potentials. Similarly, a low signal inputted to the gate electrode of the third transistor 113 and a low signal inputted to the point Q may have different potentials.

A signal inputted to the point S does not necessarily have a voltage of 0 V, and may have a voltage lower or higher than 0 V.

In the aforementioned charge pump, thin film transistors can be used as the transistors. As a result, the charge pump can be formed integrally with a display device or a nonvolatile memory such as a flash memory. When thin film transistors are used in the charge pump, however, it is difficult to raise the potential to a predetermined level because of a high threshold voltage. In addition, variations in threshold voltages of thin film transistors may cause variations in potentials to be outputted. Meanwhile, when the charge pump according to this embodiment mode is used, a predetermined charge can be outputted without being affected by voltage drop due to threshold voltage, since the voltage at the point P can be at Vdd when a low signal is inputted to the point Q as described above. Therefore, the charge pump according to this embodiment mode is extremely effective in the case of using thin film transistors having a threshold voltage higher than transistors formed on a silicon wafer. The charge pump according to this embodiment mode is also advantageous in that a charge does not leak through the first transistor 111 since the first transistor 111 can be turned off by the second transistor 112 when a high signal is inputted to the point Q.

The charge pump including thin film transistors can be formed integrally with a liquid crystal display device, a light emitting device and other display devices.

Although the first transistor 111 and the second transistor 112 have P-type conductivity and the third transistor 113 has N-type conductivity in this embodiment mode, the conductivity of the transistors is not exclusively limited. For example, a circuit configuration where the first transistor 111 and the second transistor 112 have N-type conductivity, the third transistor 113 has P-type conductivity and one electrode of the first transistor 111 is maintained at a low level potential (0 V) may be adopted as well. In this case, the direction of the diode 106 is desirably reversed to that shown in FIG. 3 as shown in Embodiment Mode 9 below. That is, in this embodiment mode, the conductivity of the transistor can be changed depending on whether one electrode of the first transistor 111 is maintained at a high level potential or a low level potential.

[Embodiment Mode 4]

Described in this embodiment mode are configuration and operation of the charge pump, which are different from those shown in Embodiment Modes 1 to 3. As set forth above, a plural-stage charge pump can multiply a voltage. In this embodiment mode, a circuit configuration that can be used for the second or later stage is described.

Figure 4A:
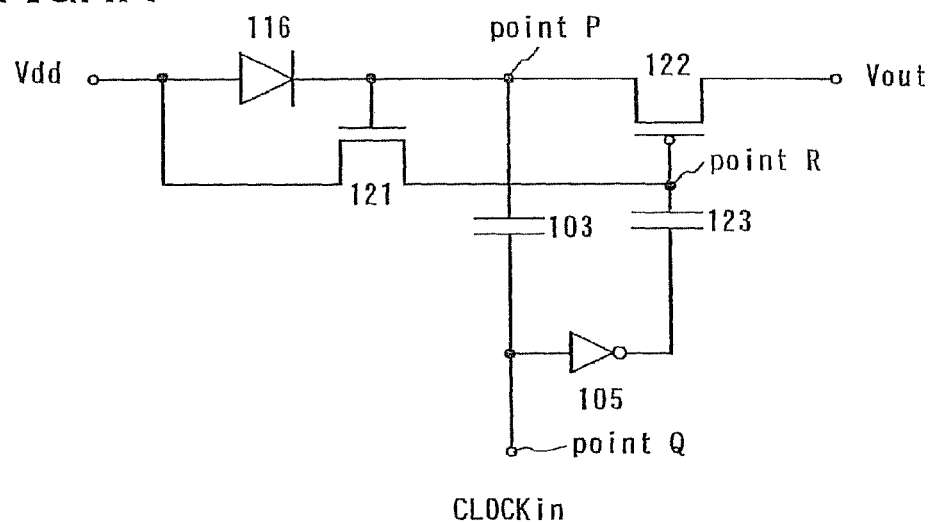
FIGS. 4A and 4B are circuit diagrams each showing a charge pump of the invention.

A charge pump shown in FIG. 4A includes a first transistor 121, a second transistor 122, the first capacitor element 103, a second capacitor element 123, the inverter 105, and a diode 116. The first capacitor element 103 in FIG. 4A corresponds to the capacitor element C1 in FIG. 13. The diode 116 has a function corresponding to the diode D1 in FIG. 13. The first transistor 121, the second transistor 122 and the second capacitor element 123 collectively function as the diode D2 in FIG. 13.

It is assumed that a high level potential is Vdd while a low level potential is 0 V for simplicity, though the invention is not limited to this. Accordingly, Vdd is inputted to and outputted from the inverter 105 as a high signal while 0 V is inputted to and outputted from the inverter 105 as a low signal. In this embodiment mode, the first transistor 121 has N-type conductivity and the second transistor 122 has P-type conductivity. The diode 116 may be any one of a PN diode, a PIN diode, a Schottky diode, and a diode connected transistor. If the diode connected transistor is used, it may have either N-type conductivity or P-type conductivity. The diode 116 may also have any element configuration and circuit configuration. For example, circuit configurations described in Embodiment Modes 1 to 3 may be adopted for the diode 116.

The connection between each element is described below.

One electrode of the first transistor 121 and the input of the diode 116 are connected to a power supply to be maintained at a high level potential of Vdd. The output of the inverter 105 is connected to the gate electrode of the second transistor 122 and the other electrode of the first transistor 121 (point R) through the second capacitor element 123. The input of the inverter 105 (point Q) is connected to the gate electrode of first transistor 121 and one electrode of the second transistor 122 through the first capacitor element 103. The output of the diode 116 (point P) is connected to the gate electrode of the first transistor 121. That is, the diode 116 is connected to the gate electrode of the first transistor 121 so as to be forwardly biased.

The operation of the charge pump having such a circuit configuration is described.

A clock signal with a high signal of Vdd and a low signal of 0 V is inputted to the input of the inverter 105 (point Q). For example, when a low signal is inputted to the input of the inverter 105 (point Q), a high signal is inputted to the second capacitor element 123 while a low signal is inputted to the first capacitor element 103. Then, the diode 116 is turned on, thereby the voltage at the point P becomes Vdd. Further, the gate electrode of the first transistor 121 as well as one electrode (source electrode) thereof becomes Vdd, therefore, the first transistor 121 is turned off. That is, Vdd is outputted from the diode 116 to the point P, thus one end of the first capacitor element 103 becomes Vdd while the other end (point Q) to which a low signal is inputted becomes 0 V, thereby a charge corresponding to Vdd is accumulated in the first capacitor element 103. Since the gate electrode of the second transistor 122 has a high level potential at this time, the second transistor 122 is turned off.

When the next clock waveform, namely a high signal is inputted to the point Q, a low signal is inputted to the second capacitor element 123 and a high signal is inputted to the first capacitor element 103. At this time, the voltage at the point P is 2×Vdd. Then, the first transistor 121 of which the gate electrode is at 2×Vdd is turned on, thereby the voltage at the gate electrode of the second transistor 122 (point R) becomes Vdd. Since one electrode of the second transistor 122 (point P) becomes 2×Vdd, the second transistor 122 is turned on. As a result, a predetermined voltage can be outputted to Vout. A charge corresponding to Vdd is accumulated in the second capacitor element 123 since the voltage at the point R is Vdd and the inverter 105 outputs a low signal.

When the next clock waveform, namely a low signal is inputted to the point Q, a high signal is inputted to the second capacitor element 123 while a low signal is inputted to the first capacitor element 103. Then, the diode 116 is turned on, a charge is supplied to the first capacitor element 103, and the voltage at the point P becomes Vdd. That is, Vdd is outputted from the diode 116, thereby one end of the first capacitor element 103 becomes Vdd and the other end thereof (point Q) to which a low signal is inputted becomes 0 V. As a result, the voltage at the point P becomes Vdd and a charge corresponding to Vdd is accumulated in the first capacitor element 103. Further, the gate electrode of the first transistor 121 as well as one electrode thereof (source electrode) becomes Vdd, thus the first transistor 121 is turned off. Accordingly, the charge in the second capacitor element 123 can be held. At this time, the voltage at the gate electrode of the second transistor 122 is 2×Vdd, thus the second transistor 122 is turned off. As a result, the charge corresponding to Vout can be prevented from leaking to the point P through the second transistor 122.

The potential at Vout can be increased to 2×Vdd by repeating such operation.

In the charge pump according to this embodiment mode, when a high signal is inputted to the point Q, the potential at the point R, namely the gate electrode of the second transistor 122 can be lowered (to Vdd) using the first transistor 121, thereby the potential at the point P can be made equal to Vout. That is, the voltage at Vout does not become 2×Vdd−Vth. Accordingly, a predetermined voltage can be outputted to Vout independently of the threshold voltage (Vth) of the second transistor 122. In other words, in the charge pump according to this embodiment mode, a predetermined voltage can be outputted to Vout without being affected by voltage drop due to the threshold voltage of the second transistor 122. Meanwhile, when a low signal is inputted to the point Q, the potential at the point R, namely the gate electrode of the second transistor 122 can be increased to 2×Vdd through the second capacitor element 123. Therefore, it can be prevented that the potential at Vout is lowered due to current leak through the second transistor 122.

This embodiment mode is not limited to the connection shown in FIG. 4A. For example, the second capacitor element 123 is connected to the point Q through the inverter 105, though this embodiment mode is not limited to this.

Different signals may be supplied to the point Q and the capacitor element 123 instead of providing the inverter 105. In this case, inverted signals are desirably supplied to the point Q and the capacitor element 123, though the invention is not limited to this. The signals supplied to the point Q and the capacitor element 123 are not necessarily inverted as long as the circuit operates normally.

A high signal inputted to the point Q is not necessarily equal to Vdd, and may have a voltage lower or higher than Vdd. Similarly, a low signal inputted to the point Q is not necessarily equal to 0 V, and may have a voltage lower or higher than 0 V.

A high signal inputted to the capacitor element 123 is not necessarily equal to Vdd, and may have a voltage lower, or higher than Vdd. Similarly, a low signal inputted to the capacitor element 123 is not necessarily equal to 0 V, and may have a voltage lower or higher than 0 V.

Figure 4B:
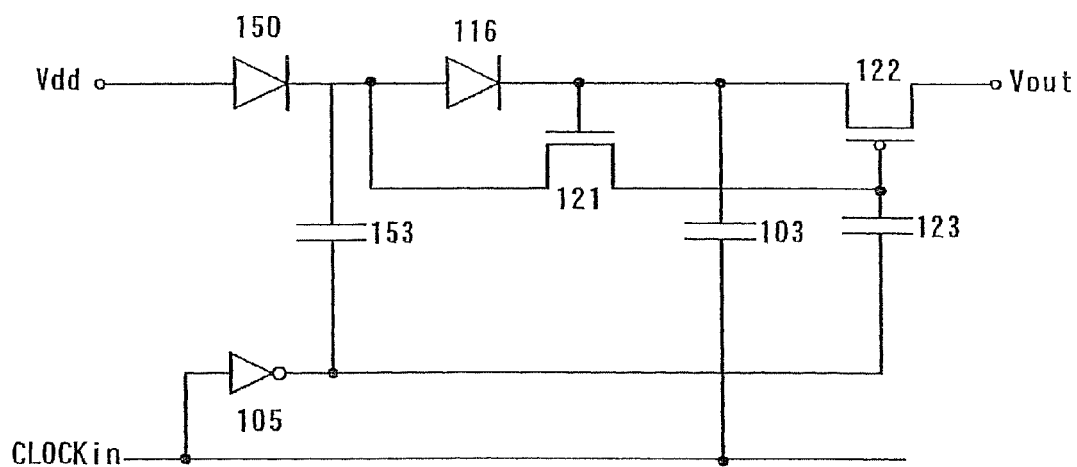

Although the circuit in FIG. 4A is applied to the second stage in this embodiment mode, it may be applied to the third or later stage as well. FIG. 4B shows an example of the circuit applied to the third stage. A diode 150 shown in FIG. 4B corresponds to the diode D1 in FIG. 13 whereas a capacitor element 153 corresponds to the capacitor element C1 in FIG. 13.

Different signals may be supplied to the capacitor elements 153, 123 and 103 instead of providing the inverter 105. In this case, inverted signals are desirably supplied to the capacitor element 153 or 123 and the capacitor element 103, though the invention is not limited to this. The signals supplied to the capacitor element 153 or 123 and the capacitor element 103 are not necessarily inverted as long as the circuit operates normally. Further, the same signal is desirably supplied to the capacitor element 153 and the capacitor element 123, though the invention is not limited to this. Different timing or voltage signals may be supplied to the capacitor element 153 and the capacitor element 123 as long as the circuit operates normally.

A high signal inputted to the capacitor element 153 is not necessarily equal to Vdd, and may have a voltage lower or higher than Vdd. Similarly, a low signal inputted to the capacitor element 153 is not necessarily equal to 0 V, and may have a voltage lower or higher than 0 V.

A high signal inputted to the capacitor element 123 is not necessarily equal to Vdd, and may have a voltage lower or higher than Vdd. Similarly, a low signal inputted to the capacitor element 123 is not necessarily equal to 0 V, and may have a voltage lower or higher than 0 V.

A high signal inputted to the capacitor element 103 is not necessarily equal to Vdd, and may have a voltage lower or higher than Vdd. Similarly, a low signal inputted to the capacitor element 103 is not necessarily equal to 0 V, and may have a voltage lower or higher than 0 V.

In the aforementioned charge pump, thin film transistors can be used as the transistors. As a result, the charge pump can be formed integrally with a display device or a nonvolatile memory such as a flash memory. When thin film transistors are used in the charge pump, however, it is difficult to raise the potential to a predetermined level because of a high threshold voltage. In addition, variations in threshold voltages of thin film transistors may cause variations in potentials to be outputted. Meanwhile, when the charge pump according to this embodiment mode is used, a predetermined charge can be outputted without being affected by voltage drop due to threshold voltage as described above. Therefore, the charge pump according to this embodiment mode is extremely effective in the case of using thin film transistors having a threshold voltage higher than transistors formed on a silicon wafer.

Either or both of the first capacitor element 103 and the second capacitor element 123 may be formed integrally with the display device. The integral formation with the display device allows reduction in the number of components. On the other hand, if the capacitor element is not faulted integrally with the display device, the capacitance of the capacitor element can be increased. The first capacitor element 103 is required to have higher capacitance than the second capacitor element 123. Thus, the smaller second capacitor element 123 may be formed integrally with the display device, thereby the number of components is reduced and cost reduction is achieved. Meanwhile, the larger first capacitor element 103 may be formed separately from the display device, thereby the capacitance of the first capacitor element 103 can be increased.

The charge pimp including thin film transistors can be formed integrally with a liquid crystal display device, a light emitting device and other display devices.

Although the first transistor 121 has N-type conductivity and the second transistor 122 has P-type conductivity in this embodiment mode, the conductivity of the transistors is not exclusively limited. For example, a circuit configuration where the first transistor 121 has P-type conductivity and the second transistor 122 has N-type conductivity, and the input of the diode is maintained at a potential of 0 V may be adopted as well. In this case, the direction of the diode 116 is desirably reversed to that shown in FIG. 4A. That is, in this embodiment mode, the conductivity of the transistor can be changed depending on whether the input of the diode is maintained at a high level potential or a low level potential.

[Embodiment Mode 5]

Described in this embodiment mode are configuration and operation of the charge pump, which are different from those shown in Embodiment Modes 1 to 4. In this embodiment mode, a circuit configuration that can be used for the second or later stage is described as is in Embodiment Mode 4.

Figure 5:
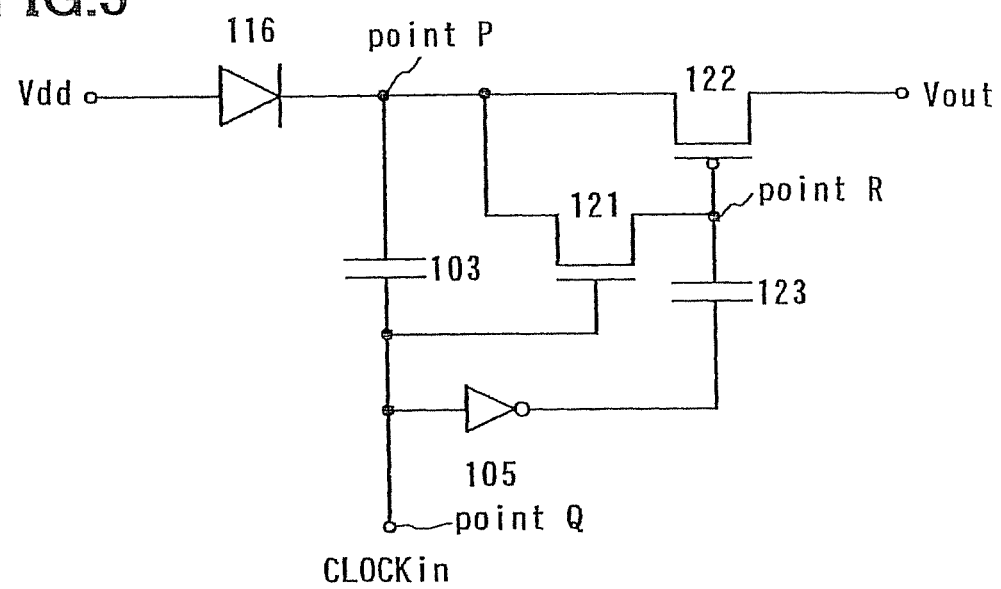
FIG. 5 is a circuit diagram showing a charge pump of the invention.

A charge pump shown in FIG. 5 includes the first transistor 121, the second transistor 122, the first capacitor element 103, the second capacitor element 123, the inverter 105, and the diode 116. In FIG. 5, the capacitor element 103 corresponds to the capacitor element C1 in FIG. 13 and the diode 116 has a function corresponding to the diode D1 in FIG. 13. The first transistor 121, the second transistor 122 and the second capacitor element 123 collectively function as the diode D2 in FIG. 13.

It is assumed that a high level potential is Vdd while a low level potential is 0 V for simplicity, though the invention is not limited to this. Accordingly, Vdd is inputted to and outputted from the inverter 105 as a high signal while 0 V is inputted to and outputted from the inverter 105 as a low signal. In this embodiment mode, the first transistor 121 has N-type conductivity and the second transistor 122 has P-type conductivity. The diode 116 may be any one of a PN diode, a PIN diode, a Schottky diode, and a diode connected transistor. If the diode connected transistor is used, it may have either N-type conductivity or P-type conductivity. The diode 116 may also have any element configuration and circuit configuration. For example, the circuit configurations described in Embodiment Modes 1 to 3 may be adopted for the diode 116.

The connection between each element is described below.

The input of the diode 116 is inputted to a power supply to be maintained at a high level potential of Vdd. The output of the inverter 105 (point Q) is connected to the gate electrode of the second transistor 122 and the other electrode of the first transistor 121 (point R) through the second capacitor element 123. The input of the inverter 105 is connected to the output of the diode 116 and one electrode of the first transistor 121 (point P) through the gate electrode of the first transistor 121 and the first capacitor element 103. That is, the diode 116 is connected to the first capacitor element 103 and one electrode of the first transistor 121 so as to be forwardly biased.

The operation of the charge pump having such a circuit configuration is described.

A clock signal with a high signal of Vdd and a low signal of 0 V is inputted to the input of the inverter 105 (point Q). For example, when a low signal is inputted to the input of the inverter 105 (point Q), a high signal is inputted to the second capacitor element 123 while a low signal is inputted to the first capacitor element 103 and the gate electrode of the first transistor 121. Then, the diode 116 is turned on and Vdd is outputted, thereby the potential at the point P becomes Vdd and a predetermined charge is accumulated in the first capacitor element 103. At this time, the potential at the point P is Vdd and the gate electrode of the first transistor 121 is at 0 V, thus the first transistor 121 is turned off. Accordingly, the voltage at both ends of the second capacitor element 123 is held. Since the gate electrode of the second transistor 122 has a high level potential at this time, the second transistor 122 is turned off.

When the next clock waveform, namely a high signal is inputted to the point Q, a low signal is inputted to the second capacitor element 123 and a high signal is inputted to the first capacitor element 103 and the gate electrode of the first transistor 121. Then, a high signal is inputted to the first capacitor element 103, and thus the potential at the point P rises by Vdd that corresponds to a high signal. Accordingly, the second transistor 122 is turned on since the potential at the source electrode thereof (i.e., the potential at the point P) is 2×Vdd and the gate electrode thereof is at 0 V. As a result, a predetermined current corresponding to the potential at the point P can be outputted to Vout to boost the voltage at Vout. At this time, the first transistor 121 of which the gate electrode is at Vdd and the potential at one electrode (i.e., the potential at the point R) is lower is turned on. Accordingly, current flows from the point P to the point R. When the voltage between the point R and the point Q, namely the gate-source voltage of the first transistor 121 becomes equal to the threshold voltage (Vth) of the first transistor 121, the first transistor 121 is turned off, thereby the potential at the point R becomes equal to Vdd−Vth. At this time, the voltage at both ends of the second capacitor element 123 is Vdd−Vth as the inverter 105 outputs a voltage of 0 V to the second capacitor element 123.

When a low signal is then inputted to the input of the inverter 105, namely the point Q, a high signal is inputted to the second capacitor element 123 while a low signal is inputted to the first capacitor element 103 and the gate electrode of the first transistor 121. As described above, the potential at the gate electrode of the first transistor 121 is 0 V whereas the potential at one electrode thereof (the potential at the point P) is Vdd, thus the first transistor 121 is turned off. Accordingly, the charge in the second capacitor element 123 is held. Further, one electrode of the second capacitor element 123 has a high level potential of Vdd, thus the potential at the point R becomes equal to (Vdd−Vth)+Vdd=2×Vdd−Vth. As a result, the potential at the gate electrode of the second transistor 122 is 2×Vdd−Vth and the potential at the point P is Vdd, thus the second transistor 122 is turned off. Accordingly, charge leak from Vout to the point P through the second transistor 122 can be prevented. As the diode 116 is turned on, a predetermined charge corresponding to Vdd is accumulated in the first capacitor element 103 as described above.

In order to turn the second transistor 122 off certainly, the absolute value of the threshold voltage Vth of the first transistor 121 should be set smaller than that of the second transistor 122. This is because the second transistor 122 is turned off easily in the case of the potential at the gate electrode thereof (point R) being high, which becomes equal to 2×Vdd−Vth when a low signal is inputted to the point Q. Here, Vth is the threshold voltage of the first transistor 121. On the other hand, when the absolute value of the threshold voltage (Vth) of the second transistor 122 is smaller than that of the first transistor 121, the potential at Vout drops by the difference therebetween.

When the second transistor 122 is turned off certainly, the charge accumulated in the first capacitor element 103 is preferably not lost.

The potential at Vout can be increased to 2×Vdd by repeating such operation.

In the charge pump according to this embodiment mode, when a high signal is inputted to the point Q, the potential at the gate electrode of the second transistor 122 (point R) can be lowered using the first transistor 121, thereby the potential at the point P can be made equal to Vout. That is, the voltage at Vout does not become 2×Vdd−Vth. Accordingly, a predetermined voltage can be outputted to Vout independently of the threshold voltage (Vth) of the second transistor 122. In other words, in the charge pump according to this embodiment mode, a predetermined voltage can be outputted to Vout without being affected by voltage drop due to the threshold voltage of the second transistor 122.

Meanwhile, when a low signal is inputted to the point Q, the potential at the point R (the gate electrode of the second transistor 122) can be increased using the second capacitor element 123. Therefore, it can be prevented that the potential at Vout is lowered through the second transistor 122.

This embodiment mode is not limited to the connection shown in FIG. 5. Different signals may be supplied to the point Q and the capacitor element 123 instead of providing the inverter 105. In this case, inverted signals are desirably supplied to the point Q and the capacitor element 123, though the invention is not limited to this. The signals supplied to the point Q and the capacitor element 123 are not necessarily inverted as long as the circuit operates normally.

A high signal inputted to the point Q is not necessarily equal to Vdd, and may have a voltage lower or higher than Vdd. Similarly, a low signal inputted to the point Q is not necessarily equal to 0 V, and may have a voltage lower or higher than 0 V.

A high signal inputted to the capacitor element 123 is not necessarily equal to Vdd, and may have a voltage lower or higher than Vdd. Similarly, a low signal inputted to the capacitor element 123 is not necessarily equal to 0 V, and may have a voltage lower or higher than 0 V.

In the aforementioned charge pump, thin film transistors can be used as the transistors. As a result, the charge pump can be formed integrally with a display device or a nonvolatile memory such as a flash memory. When thin film transistors are used in the charge pump, however, it is difficult to raise the potential to a predetermined level because of a high threshold voltage. In addition, variations in threshold voltages of thin film transistors may cause variations in potentials to be outputted. Meanwhile, when the charge pimp according to this embodiment mode is used, voltage drop due to threshold voltage can be prevented as described above. Therefore, the charge pump according to this embodiment mode is extremely effective in the case of using thin film transistors having a threshold voltage higher than transistors formed on a silicon wafer.

The charge pump including thin film transistors can be formed integrally with a pixel portion of a liquid crystal display device, a light emitting device and other display devices. At this time, either or both of the first capacitor element 103 and the second capacitor element 123 may be formed integrally with the display device. The integral formation with the display device allows reduction in the number of components. On the other hand, if the capacitor element is not formed integrally with the display play device, the capacitance of the capacitor element can be increased. The first capacitor element 103 is required to have higher capacitance than the second capacitor element 123. Thus, the smaller second capacitor element 123 may be formed integrally with the display device, thereby the number of components is reduced and cost reduction is achieved. Meanwhile, the larger first capacitor element 103 may be formed separately from the display device, thereby the capacitance of the first capacitor element 103 can be increased.

Although the first transistor has N-type conductivity and the second transistor has P-type conductivity in this embodiment mode, the conductivity of the transistors is not exclusively limited. For example, a circuit configuration where the first transistor has P-type conductivity and the second transistor has N-type conductivity, and the input of the diode is maintained at a potential of 0 V may be adopted as well. In this case, the direction of the diode 116 is desirably reversed to that shown in FIG. 5. That is, in this embodiment mode, the conductivity of the transistor can be changed depending on whether the input of the diode is maintained at a high level potential or a low level potential.

[Embodiment Mode 6]

Described in this embodiment mode are configuration and operation of the charge pump, which are different from those shown in Embodiment Modes 1 to 5. In this embodiment mode, a circuit configuration that can be used for the second or later stage is described as is in Embodiment Modes 4 and 5.

Figure 6:
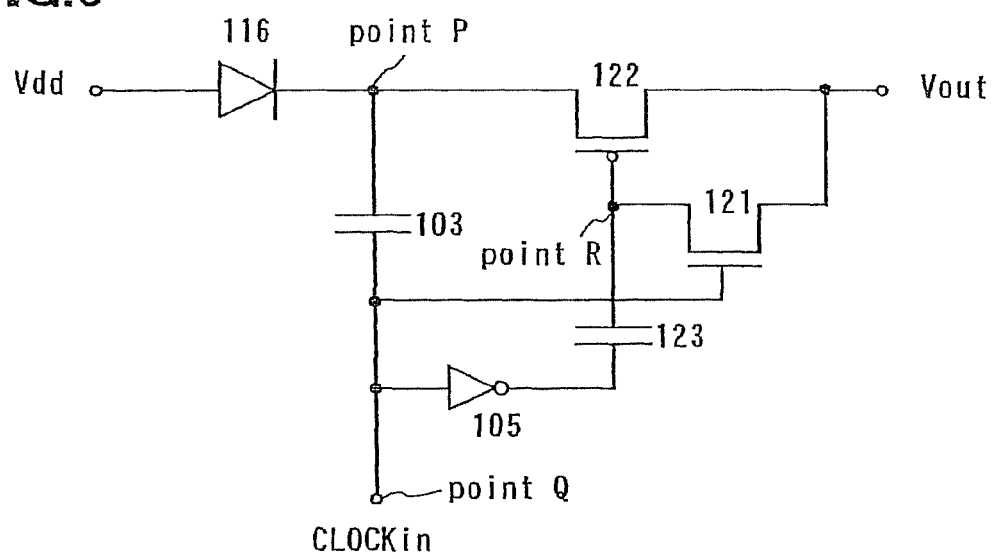
FIG. 6 is a circuit diagram showing a charge pump of the invention.

A charge pump shown in FIG. 6 includes the first transistor 121, the second transistor 122, the first capacitor element 103, the second capacitor element 123, the inverter 105, and the diode 116. The first capacitor element 103 in FIG. 6 corresponds to the capacitor element C1 in FIG. 13 and the diode 116 has a function corresponding to the diode D1 in FIG. 13. The first transistor 121, the second transistor 122 and the second capacitor element 123 collectively function as the diode D2 in FIG. 13.

It is assumed that a high level potential is Vdd while a low level potential is 0 V for simplicity, though the invention is not limited to this. Accordingly, Vdd is outputted from the inverter 105 as a high signal while 0 V is outputted from the inverter 105 as a low signal. In this embodiment mode, the first transistor 121 has N-type conductivity and the second transistor 122 has P-type conductivity. The diode 116 may be any one of a PN diode, a PIN diode, a Schottky diode, and a diode connected transistor. If the diode connected transistor is used, it may have either N-type conductivity or P-type conductivity. The diode 116 may also have any element configuration and circuit configuration. For example, the circuit configurations described in Embodiment Modes 1 to 3 may be adopted for the diode 116.

The connection between each element is described below.

The input of the diode 116 is connected to a power supply to be maintained at a high level potential of Vdd. The output of the inverter 105 is connected to the gate electrode of the second transistor 122 and one electrode of the first transistor 121 (point R) through the second capacitor element 123. The input of the inverter 105 (point Q) is connected to the gate electrode of the first transistor 121 and connected to one electrode of the second transistor 122 and the output of the diode 116 (point P) through the first capacitor element 103. That is, the diode 116 is connected to the first capacitor element 103 and one electrode of the second transistor 122. The circuit configuration of the charge pump shown in this embodiment mode is different from that shown in Embodiment Mode 5 in that the other electrode of the first transistor 121 is connected to the other electrode of the second transistor 122.

The operation of the charge pump having such a circuit configuration is described.

A clock signal with a high signal of Vdd and a low signal of 0 V is inputted to the input of the inverter 105 (point Q). For example, when a low signal is inputted to the input of the inverter 105 (point Q), a high signal is inputted to the second capacitor element 123 while a low signal is inputted to the first capacitor element 103 and the gate electrode of the first transistor 121. Then, the diode 116 is turned on and Vdd is outputted to the point P while 0 V is inputted to the point Q, thereby a predetermined charge corresponding to Vdd is accumulated in the first capacitor element 103. Since the gate electrode of the second transistor 122 (point R) has a high level potential at this time, the second transistor 122 is turned off. At this time, the first transistor 121 of which the gate electrode is at 0 V and one electrode (point R) is at Vdd is turned off.

When the next clock waveform, namely a high signal is inputted to the point Q, a low signal is inputted to the second capacitor element 123 while a high signal is inputted to the first capacitor element 103 and the gate electrode of the first transistor 121. The first transistor 121 of which the gate electrode (point Q) is at Vdd and the other electrode (point R) has a low level potential is turned on. Accordingly, current flows from Vout to the point R. Then, when the voltage between the point Q and the point R, namely the gate-source voltage of the first transistor 121 becomes equal to Vth, the first transistor 121 is turned off. Since the voltage at the point Q is Vdd at this time, the voltage at the point R becomes Vdd−Vth. Thus, a charge corresponding to Vgs of the first transistor 121, namely Vdd−Vth of the first transistor 121 is accumulated in the second capacitor element 123. A high signal is inputted to the first capacitor element 103, therefore, the voltage at the point P increases by Vdd corresponding to a high signal. At this time, the second transistor 122 of which one electrode (point P) is at 0 V×Vdd and the gate electrode is at Vdd−Vth is turned on. As a result, a predetermined current corresponding to 2×Vdd can be outputted to Vout, thereby the voltage at Vout is boosted.

When a low signal is then inputted to the input of the inverter 105 (point Q), a high signal is inputted to the second capacitor element 123 while a low signal is inputted to the first capacitor element 103 and the gate electrode of the first transistor 121. As described above, the voltage at the gate electrode of the first transistor 121 is 0 V whereas the potential at one electrode thereof (the potential at the point P) is Vdd, thus the first transistor 121 is turned off. Accordingly, the charge in the second capacitor element 123 is held. Further, one electrode of the second capacitor element 123 has a high level potential of Vdd, thus the potential at the point R becomes equal to (Vdd−Vth)+Vdd=2×Vdd−Vth. As a result, the voltage at the gate electrode of the second transistor 122 is 2×Vdd−Vth and Vout is at 0 V×Vdd, thus the second transistor 122 is turned off. As the diode 116 is turned on and the potential at the point P is Vdd, a predetermined charge corresponding to Vdd is accumulated in the first capacitor element 103 as described above.

In order to turn the second transistor 122 off certainly, the absolute value of the threshold voltage Vth of the first transistor 121 should be set smaller than that of the second transistor 122. This is because the second transistor 122 is turned off easily in the case of the potential at the gate electrode thereof (point R) being high, which becomes equal to 2×Vdd−Vth when a low signal is inputted to the point Q. Here, Vth is the threshold voltage of the first transistor 121. On the other hand, when the absolute value of the threshold voltage (Vth) of the second transistor 122 is smaller than that of the first transistor 121, the potential at Vout drops by the difference therebetween.

When the second transistor 122 is turned off certainly, the accumulated charge of 2×Vdd is preferably not lost.

The potential at Vout can be increased to 2×Vdd by repeating such operation.

In the charge pump according to this embodiment mode, a predetermined charge can be outputted to Vout independently of the threshold voltage (Vth) of the second transistor 122. In other words, in the charge pump according to this embodiment mode, a predetermined charge can be accumulated without being affected by voltage drop due to the threshold voltage of the second transistor 122.

This embodiment mode is not limited to the connection shown in FIG. 6. Different signals may be supplied to the point Q and the capacitor element 123 instead of providing the inverter 105. In this case, inverted signals are desirably supplied to the point Q and the capacitor element 123, though the invention is not limited to this. The signals supplied to the point Q and the capacitor element 123 are not necessarily inverted as long as the circuit operates normally.

A high signal inputted to the point Q is not necessarily equal to Vdd, and may have a voltage lower or higher than Vdd. Similarly, a low signal inputted to the point Q is not necessarily equal to 0 V, and may have a voltage lower or higher than 0 V.

A high signal inputted to the capacitor element 123 is not necessarily equal to Vdd, and may have a voltage lower or higher than Vdd. Similarly, a low signal inputted to the capacitor element 123 is not necessarily equal to 0 V, and may have a voltage lower or higher than 0 V.

In the aforementioned charge pump, thin film transistors can be used as the transistors. As a result, the charge pump can be formed integrally with a display device or a nonvolatile memory such as a flash memory. When thin film transistors are used in the charge pump, however, it is difficult to raise the potential to a predetermined level, because of a high threshold voltage. In addition, variations in threshold voltages of thin film transistors may cause variations in potentials to be outputted. Meanwhile, when the charge pump according to this embodiment mode is used, voltage drop due to threshold voltage can be prevented as described above. Therefore, the charge pump according to this embodiment mode is extremely effective in the case of using thin film transistors having a threshold voltage higher than transistors formed on a silicon wafer.

The charge pump including thin film transistors can be formed integrally with a pixel portion of a liquid crystal display device, a light emitting device and other display devices. At this time, either or both of the first capacitor element 103 and the second capacitor element 123 may be formed integrally with the display device. The integral formation with the display device allows reduction in the number of components. On the other hand, if the capacitor element is not formed integrally with the display device, the capacitance of the capacitor element can be increased. The first capacitor element 103 is required to have higher capacitance than the second capacitor element 123. Thus, the smaller second capacitor element 123 may be formed integrally with the display device, thereby the number of components is reduced and cost reduction is achieved. Meanwhile, the larger first capacitor element 103 may be formed separately from the display device, thereby the capacitance of the first capacitor element 103 can be increased.

Although the first transistor has N-type conductivity and the second transistor has P-type conductivity in this embodiment mode, the conductivity of the transistors is not exclusively limited. For example, a circuit configuration where the first transistor has P-type conductivity and the second transistor has N-type conductivity, and the input of the diode is maintained at a potential of 0 V may be adopted as well. In this case, the direction of the diode 116 is desirably reversed to that shown in FIG. 6. That is, in this embodiment mode, the conductivity of the transistor can be changed depending on whether the input of the diode is maintained at a high level potential or a low level potential.

[Embodiment Mode 7]

Described in this embodiment mode are configuration and operation of the charge pump, which are different from those shown in Embodiment Modes 1 to 6. In this embodiment mode, a circuit configuration that can be used for the second or later stage is described as is in Embodiment Modes 4 to 6.

Figure 7A:
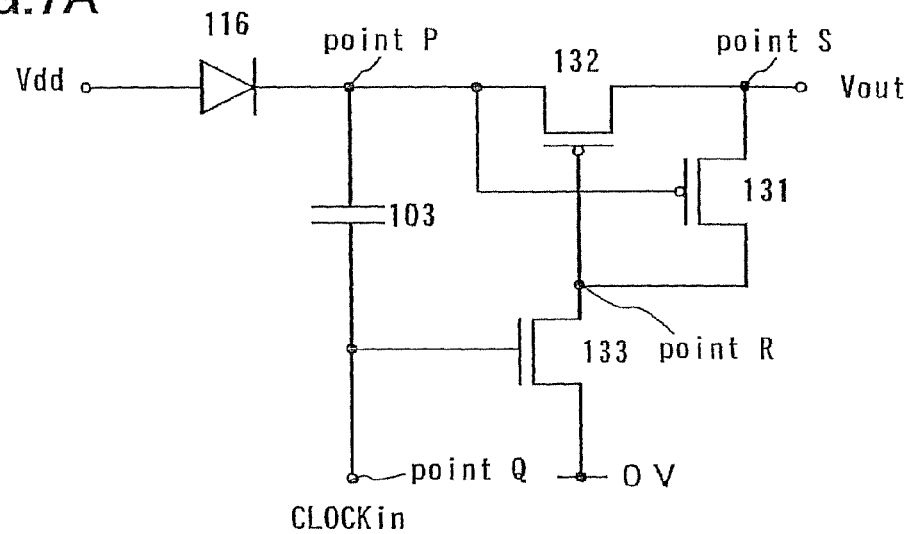
FIGS. 7A and 7B are circuit diagrams each showing a charge pump of the invention.

A charge pump shown in FIG. 7A includes a first transistor 131, a second transistor 132, a third transistor 133, the capacitor element 103, and the diode 116. That is, the charge pump in this embodiment mode does not include an inverter. The capacitor element 103 in FIG. 7A corresponds to the capacitor element C1 in FIG. 13 and the diode 116 has a function corresponding to the diode D1 in FIG. 13. The first transistor 131, the second transistor 132 and the third transistor 133 collectively function as the diode D2 in FIG. 13.

It is assumed that a high level potential is Vdd while a low level potential is 0 V for simplicity, though the invention is not limited to this. Accordingly, Vdd is inputted to the point Q as a high signal while 0 V is inputted to the point Q as a low signal. In this embodiment mode, the first transistor 131 and the second transistor 132 have P-type conductivity and the third transistor 133 has N-type conductivity. The diode 116 may be any one of a PN diode, a PIN diode, a Schottky diode, and a diode connected transistor. If the diode connected transistor is used, it may have either N-type conductivity or P-type conductivity. The diode 116 may also have any element configuration and circuit configuration. For example, the circuit configurations described in Embodiment Modes 1 to 3 may be adopted for the diode 116.

The connection between each element is described below.

The input of the diode 116 is connected to a power supply to be maintained at a high level potential of Vdd. The output of the diode 116 (point P) is connected to the gate electrode of the first transistor 131 and one electrode of the second transistor 132, and connected to the gate electrode of the third transistor 133 (point Q) through the capacitor element 103. That is, the diode 116 is connected to the capacitor element 103, the gate electrode of the first transistor 131 and one electrode of the second transistor 132. One electrode of the first transistor 131 is connected to the other electrode of the second transistor 132, whereas the other electrode of the first transistor 131 is connected to one electrode of the third transistor 133 (point R). The other electrode of the third transistor 133 has a voltage of 0 V.

The operation of the charge pump having such a configuration is described.

A clock signal with a high signal of Vdd and a low signal of 0 V is inputted to the point Q. For example, when a high signal is inputted to the point Q, a high signal is inputted to the capacitor element 103 and the gate electrode of the third transistor 133. At this time, the third transistor 133 of which the gate electrode is at Vdd and one electrode is at 0 V is turned on. The second transistor 132 of which the gate electrode (point R) is at 0 V is turned on. Thus, the potential at the other electrode of the second transistor 132, namely Vout becomes equal to the potential at the point P. As a result, a predetermined current accumulated in the capacitor element 103 can be outputted to Vout, thereby the voltage at Vout is boosted. Since the potential at Vout is equal to that at the point P, the first transistor 131 is turned off.

When the next clock waveform, namely a low signal is inputted to the point Q, a low signal is inputted to the capacitor element 103 and the gate electrode of the third transistor 133. At this time, the third transistor 133 of which the gate electrode (point Q) is at 0 V and one electrode is at 0 V is turned off. Further, Vdd is outputted from the diode 116 to the point P, thereby a charge corresponding to Vdd is accumulated in the capacitor element 103. The first transistor 131 of which the gate electrode (point P) is at Vdd and one electrode is at 0 V×Vdd is turned on. As a result, the potential at Vout becomes equal to that at the point R, thus the second transistor 132 is turned off. Accordingly, charge leak from Vout to the point P through the second transistor 132 can be prevented.

When the next clock waveform, namely a high signal is then inputted to the point Q, a high signal is inputted to the capacitor element 103 and the gate electrode of the third transistor 133. At this time, the third transistor 133 of which the gate electrode is at Vdd and one electrode is at 0 V is turned on. The second transistor 132 of which the gate electrode (point R) is at 0 V is turned on. Thus, the potential at the other electrode of the second transistor 132, namely Vout becomes equal to the potential at the point P, namely 2×Vdd. As a result, a predetermined current accumulated in the capacitor element 103 can be outputted to Vout, thereby the voltage at Vout is boosted. Since the potential at Vout is equal to that at the point P, the first transistor 131 is turned off.

The potential at Vout can be increased to 2×Vdd by repeating such operation.

In the charge pump according to this embodiment mode, a predetermined charge can be outputted to Vout independently of the threshold voltage (Vth) of the second transistor 132. That is, in the charge pump according to this embodiment mode, a predetermined charge can be accumulated without being affected by voltage drop due to the threshold voltage of the second transistor 132.

Different signals may be supplied to the capacitor element 103 and the gate electrode of the third transistor 133. In this case, the same signal is desirably supplied to the capacitor element 103 and the gate electrode of the third transistor 133, though the invention is not limited to this. Different timing or voltage signals may be supplied to the capacitor element 103 and the gate electrode of the third transistor 133 as long as the circuit operates normally.

A high signal inputted to the capacitor element 103 is not necessarily equal to Vdd, and may have a voltage lower or higher than Vdd. Similarly, a low signal inputted to the capacitor element 103 is not necessarily equal to 0 V, and may have a voltage lower or higher than 0 V.

A high signal inputted to the gate electrode of the third transistor 133 is not necessarily equal to Vdd, and may have a voltage lower or higher than Vdd. Similarly, a low signal inputted to the gate electrode of the third transistor 133 is not necessarily equal to 0 V, and may have a voltage lower or higher than 0 V.

A high signal inputted to the gate electrode of the third transistor 133 and a high signal inputted to the capacitor element 103 may have different potentials. Similarly, a low signal inputted to the gate electrode of the third transistor 113 and a low signal inputted to the capacitor element 103 may have different potentials.

A signal inputted to the source electrode of the third transistor 133 is not necessarily equal to 0 V, and may have a voltage lower or higher than 0 V.

Figure 7B:
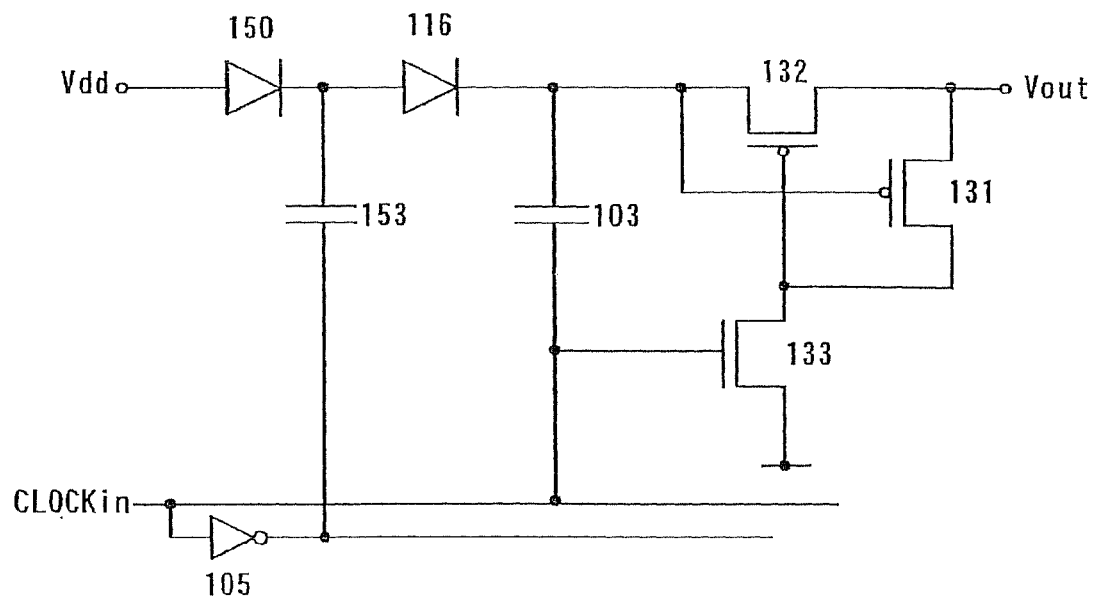

Although the circuit shown in FIG. 7A is applied to the second stage in this embodiment mode, it may be applied to the third or later stage as well. FIG. 7B shows an example of the circuit applied to the third stage. The diode 150 corresponds to the diode D1 in FIG. 13 and the capacitor element 153 corresponds to the capacitor element C1 in FIG. 13.

Different signals may be supplied to the capacitor element 153 and the capacitor element 103 instead of providing the inverter 105. In this case, inverted signals are desirably supplied to the capacitor element 153 and the capacitor element 103, though the invention is not limited to this. The signals supplied to the capacitor element 153 and the capacitor element 103 are not necessarily inverted as long as the circuit operates normally.

A high signal inputted to the capacitor element 153 is not necessarily equal to Vdd, and may have a voltage lower or higher than Vdd. Similarly, a low signal inputted to the capacitor element 153 is not necessarily equal to 0 V, and may have a voltage lower or higher than 0 V.

A high signal inputted to the capacitor element 103 is not necessarily equal to Vdd, and may have a voltage lower or higher than Vdd. Similarly, a low signal inputted to the capacitor element 103 is not necessarily equal to 0 V, and may have a voltage lower or higher than 0 V.

In the aforementioned charge pump, thin film transistors can be used as the transistors. As a result, the charge pump can be formed integrally with a display device or a nonvolatile memory such as a flash memory. When thin film transistors are used in the charge pump, however, it is difficult to raise the potential to a predetermined level because of a high threshold voltage. In addition, variations in threshold voltages of thin film transistors may cause variations in potentials to be outputted. Meanwhile, when the charge pump according to this embodiment mode is used, voltage drop due to threshold voltage can be prevented as described above. Therefore, the charge pump according to this embodiment mode is extremely effective in the case of using thin film transistors having a threshold voltage higher than transistors formed on a silicon wafer.

The charge pump including thin film transistors can be formed integrally with a pixel portion of a liquid crystal display device, a light emitting device and other display devices. At this time, either or both of the first capacitor element 103 and the second capacitor element 153 may be formed integrally with the display device. The integral formation with the display device allows reduction in the number of components. On the other hand, if the capacitor element is not formed integrally with the display device, the capacitance of the capacitor element can be increased. The first capacitor element 103 is required to have higher capacitance than the second capacitor element 153. Thus, the smaller second capacitor element 153 may be formed integrally with the display device, thereby the number of components is reduced and cost reduction is achieved. Meanwhile, the larger first capacitor element 103 may be formed separately from the display device, the capacitance of the first capacitor element 103 can be increased.

Although the first transistor 131 and the second transistor 132 have P-type conductivity and the third transistor 133 has N-type conductivity in this embodiment mode, the conductivity of the transistors is not exclusively limited. For example, a circuit configuration where the first transistor 131 and the second transistor 132 have N-type conductivity and the third transistor 133 has P-type conductivity, and the input of the diode is maintained at a low level potential of 0 V may be adopted as well. In this case, the direction of the diode 116 is desirably reversed to that shown in FIG. 7A. That is, in this embodiment mode, the conductivity of the transistor can be changed depending on whether the input of the diode is maintained at a high level potential or a low level potential.

[Embodiment Mode 8]

Described in this embodiment mode are configuration and operation of the charge pump where the circuit configuration described in Embodiment Mode 1 that can be used for the first stage is combined with the circuit configuration described in Embodiment Mode 4 that can be used for the second or later stage.

Figure 8:
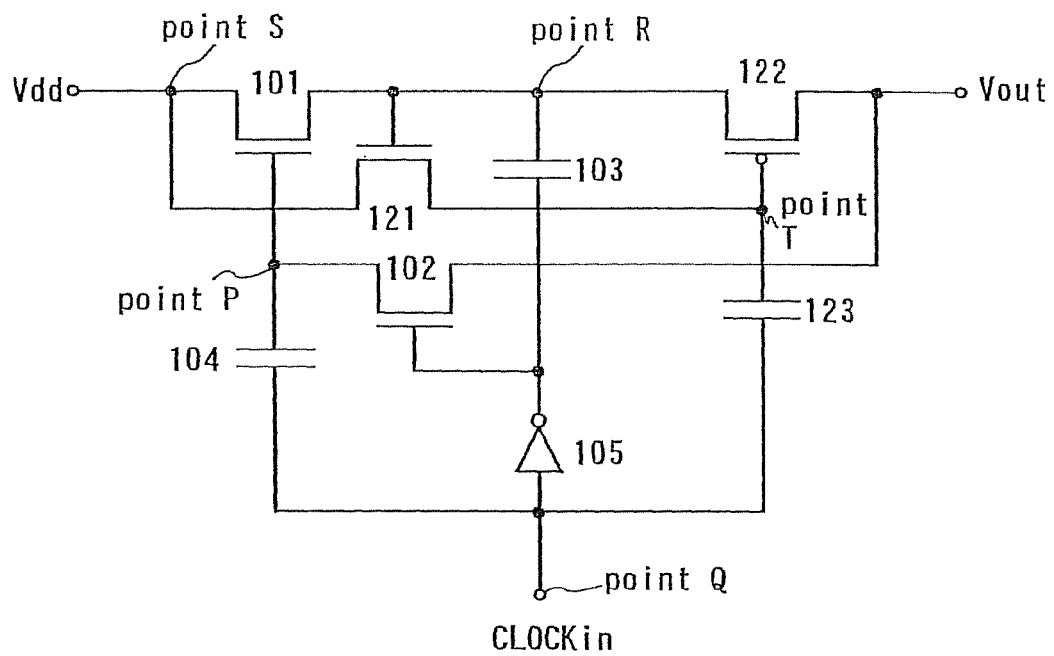
FIG. 8 is a circuit diagram showing a charge pump of the invention.

A charge pump shown in FIG. 8 includes the first transistor 101, the second transistor 102, the third transistor 121, the fourth transistor 122, the first capacitor element 103, the second capacitor element 104, the third capacitor element 123, and the inverter 105. The configuration in FIG. 8 can be obtained by combining FIG. 1A and FIG. 4A. In such a combined charge pump as shown in this embodiment mode, the inverter can be shared. The first capacitor element 103 in FIG. 8 corresponds to the capacitor element C1 in FIG. 13, and the first transistor 101, the second transistor 102 and the second capacitor element 104 correspond to the diode D1. The third transistor 121, the fourth transistor 122 and the third capacitor element 123 correspond to the diode D2 in FIG. 13. It is assumed that a high level potential is Vdd while a low level potential is 0 V for simplicity, though the invention is not limited to this. Accordingly, Vdd is outputted from the inverter 105 as a high signal while 0 V is outputted from the inverter 105 as a low signal. In this embodiment mode, the first to third transistors 101, 102 and 121 have N-type conductivity and the fourth transistor 122 has P-type conductivity.

The connection between each element is described hereinafter.

One electrode of the first transistor 101 (point S) is connected to a power supply to be maintained at a high level potential of Vdd and connected to one electrode of the third transistor 121. The output of the inverter 105 is connected to the gate electrode of the second transistor 102 and connected to the gate electrode of the third transistor 121 and one electrode of the fourth transistor 122 (point R) through the first capacitor element 103. The input of the inverter 105 (point Q) is connected to the gate electrode of the first transistor 101 and one electrode of the second transistor 102 (point P) though the second capacitor element 104, and connected to the gate electrode of the fourth transistor 122 and the other electrode of the third transistor 121 (point T) through the third capacitor element 123. The other electrode of the first transistor 101 is connected to the gate electrode of the third transistor and one electrode of the fourth transistor 122. The other electrode of the second transistor 102 is connected to the other electrode of the fourth transistor 122.

The operation of the charge pump having such a circuit configuration is similar to that shown in Embodiment Modes 1 and 7, therefore the description thereof is omitted herein.

As set forth above, the circuit configurations described in Embodiment Modes 1 to 3 and the circuit configurations described in Embodiment Modes 4 to 7 can be combined freely.

Figure 18:
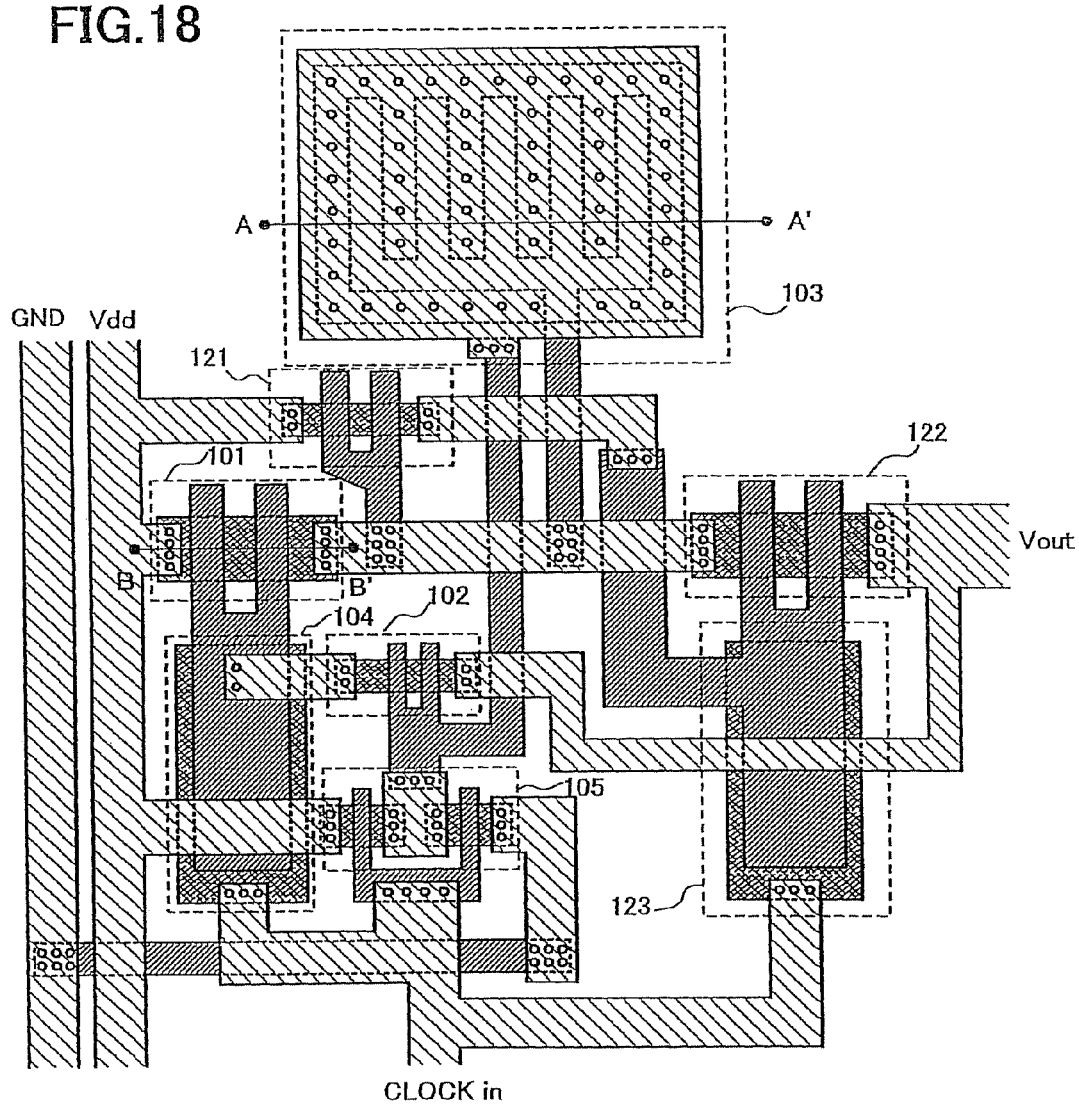
FIG. 18 is a top plan view showing a charge pump of the invention.

FIG. 18 shows a layout example to obtain the charge pimp shown in FIG. 8. The first transistor 101 and the fourth transistor 122 have a larger channel width than the second transistor 102 and the third transistor 121.

The first capacitor element 103, the second capacitor element 104 and the third capacitor element 123 can be constituted by a semiconductor film added with an N-type impurity, an insulating film such as a gate insulating film, and a conductive film to be a gate electrode, or a conductive film to be a gate electrode, an insulating film such as an interlayer insulating film, and a conductive film to be a wiring. The mobility of charges in the semiconductor film is lower than in the conductive film. Therefore, in the first capacitor element 103, the conductive film has a comb shape so that charges may move accurately even in the center of the semiconductor film. The semiconductor film and the wiring are connected to each other through a number of contact holes formed in the interlayer insulating film and the gate insulating film. As a result, the capacitor elements sharing the conductive film to be a gate electrode are connected in parallel, leading to increased capacitance.

Figure 19:
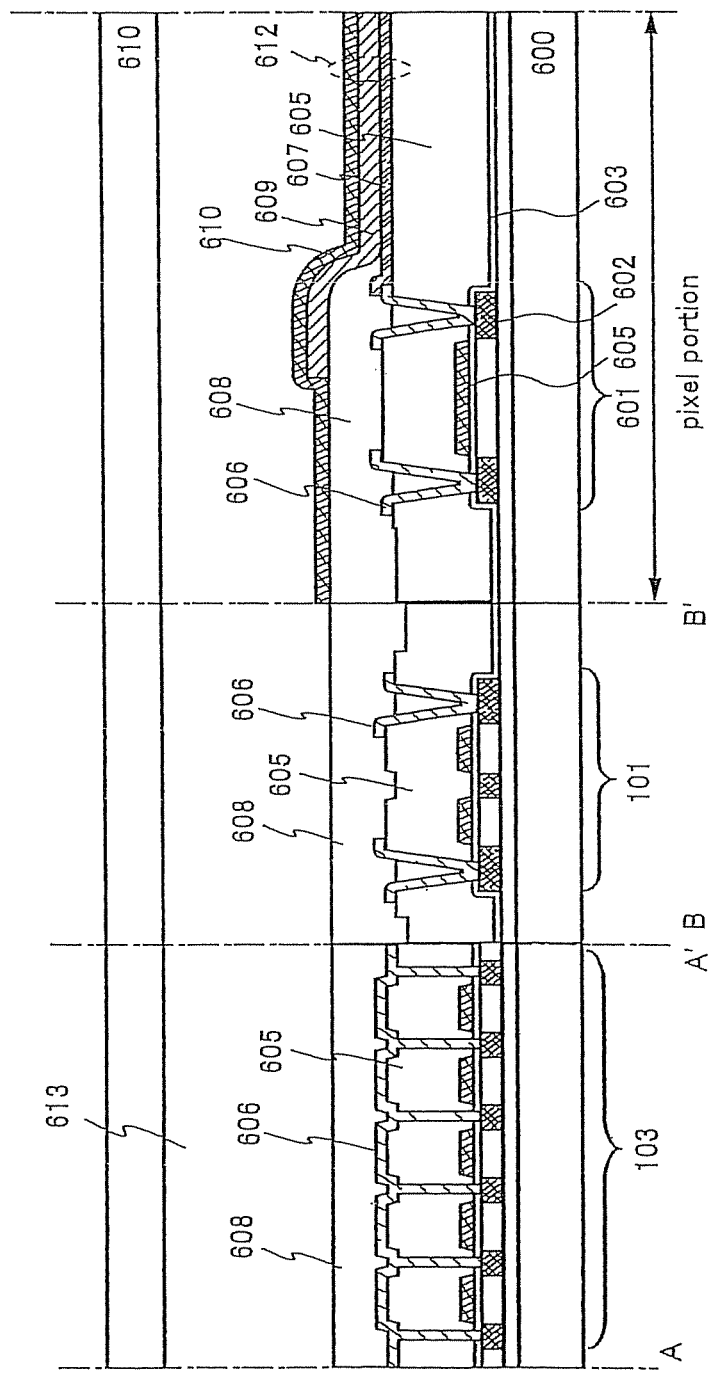
FIG. 19 is a cross sectional view of a charge pump and a pixel portion of the invention.

FIG. 19 shows a cross sectional view of FIG. 18 along lines A-A' and B-B' and a pixel portion formed integrally therewith.

In the first capacitor element 103, the first transistor 101 and the pixel portion, thin film transistors 601 and 101 are formed, where a semiconductor film 602, a gate insulating film 603 covering the semiconductor film 602, a gate electrode 605, an impurity region formed utilizing the gate electrode 605 in a self aligned manner, and a wiring 606 connected to the impurity region are formed over an insulating substrate 600 with a base film interposed therebetween. The thin film transistor is used as the first transistor 101. An interlayer insulating film 605 is formed to improve planarity. The interlayer insulating film 605 is formed of an inorganic material or an organic material and has a single layer structure or a multilayer structure.

A first electrode 607 connected to the wiring 606, an electroluminescent layer 609, and a second electrode 610 are formed, which collectively constitute a light emitting element 612. At this time, a separation layer 608 formed of an insulating film is formed so as to discriminate the electroluminescent layer 609.

The insulating film is formed of an inorganic material or an organic material and has a single layer structure or a multilayer structure. In the capacitor element 103 region, the wiring 606 is connected to the semiconductor film 602 through a contact hole formed in the interlayer insulating film 605 and the gate insulating film 603. In this manner, the capacitor element 103 capable of holding large capacitance can be manufactured.

Instead of forming the impurity region utilizing the gate electrode in a self aligned manner, the impurity region may be formed in the entire semiconductor film constituting the capacitor element 103.

Subsequently, a counter substrate 610 is attached. If a space 613 is generated by attaching the counter substrate 610, it is preferably filled with gas such as nitrogen in order to prevent moisture that causes degradation of the light emitting element from entering. Alternatively, the space 613 may be filled with an adhesive such as resin. A light emitting device is thus completed.

In the charge pump according to this embodiment mode, a predetermined charge can be outputted to Vout independently of the threshold voltage (Vth) of the first transistor 101 and the second transistor 102. That is, in the charge pump according to this embodiment mode, a voltage can be outputted to Vout without being affected by voltage drop due to the threshold voltage of the first transistor 101 and the second transistor 102.

In the aforementioned charge pump, thin film transistors can be used as the transistors. As a result, the charge pump can be formed integrally with a display device or a nonvolatile memory such as a flash memory. When thin film transistors are used in the charge pump, however, it is difficult to raise the potential to a predetermined level because of a high threshold voltage. In addition, variations in threshold voltages of thin film transistors may cause variations in potentials to be outputted. Meanwhile, when the charge pump according to this embodiment mode is used, voltage drop due to threshold voltage can be prevented as described above. Therefore, the charge pump according to this embodiment mode is extremely effective in the case of using thin film transistors having a threshold voltage higher than transistors formed on a silicon wafer.

The charge pump including thin film transistors can be formed integrally with a pixel portion of a liquid crystal display device, a light emitting device and other display devices. At this time, either or both of the first capacitor element 103 and the second capacitor element 104 may be formed integrally with the display device. The integral formation with the display device allows reduction in the number of components. On the other hand, if the capacitor element is not formed integrally with the display device, the capacitance of the capacitor element can be increased. The first capacitor element 103 is required to have higher capacitance than the second capacitor element 104. Thus, the smaller second capacitor element 104 may be formed integrally with the display device, thereby the number of components is reduced and cost reduction is achieved. Meanwhile, the larger first capacitor element 103 may be formed separately from the display device, thereby the capacitance of the first capacitor element 103 can be increased.

Although the first to third transistors have N-type conductivity and the fourth transistor has P-type conductivity in this embodiment mode, the conductivity of the transistors is not exclusively limited. For example, a circuit configuration where the first to third transistors have P-type conductivity and the fourth transistor has N-type conductivity, and one electrode of the first transistor is maintained at a low level potential of 0 V may be adopted as well. That is, in this embodiment mode, the conductivity of the transistor can be changed depending on whether one electrode of the first transistor is maintained at a high level potential or a low level potential.

A charge pump can be configured by combining the booster circuits described in the aforementioned embodiment modes. For example, the following charge pumps can be obtained.

Figure 20:
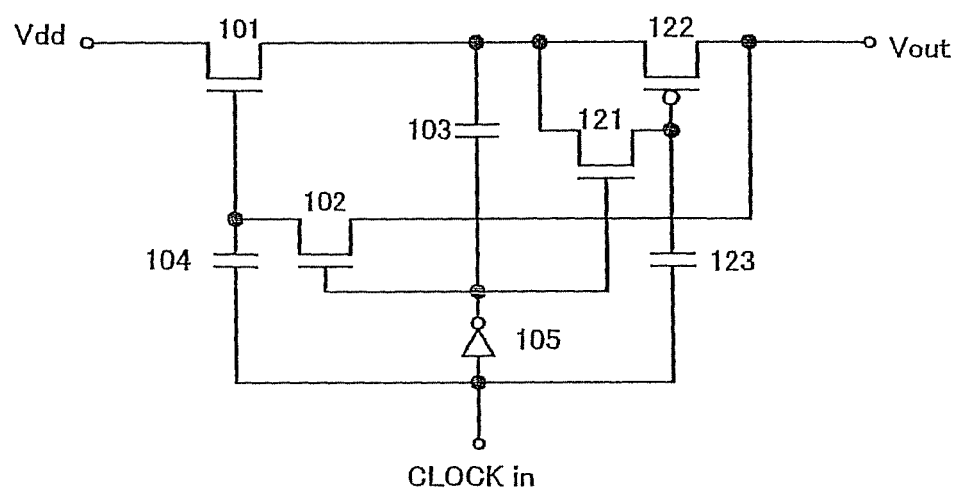
FIG. 20 is a circuit diagram showing a charge pump of the invention.

FIG. 20 shows a circuit configuration of a charge pimp configured by the circuit shown in FIG. 1A that can be used for the first stage and the circuit shown in FIG. 5 that can be used for the second or later stage.

Figure 21:
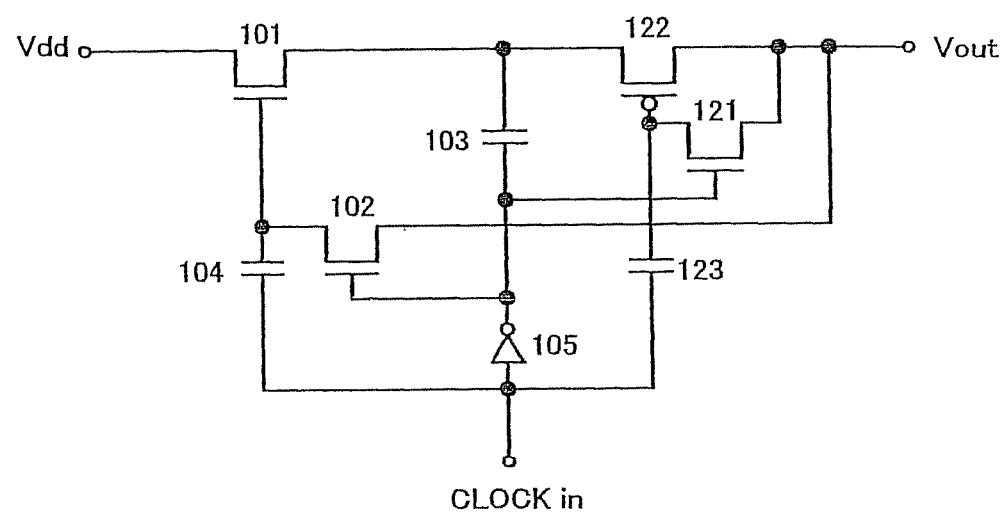
FIG. 21 is a circuit diagram showing a charge pump of the invention.

FIG. 21 shows a circuit configuration of a charge pump configured by the circuit shown in FIG. 1A that can be used for the first stage and the circuit shown in FIG. 6 that can be used for the second or later stage.

Figure 22:
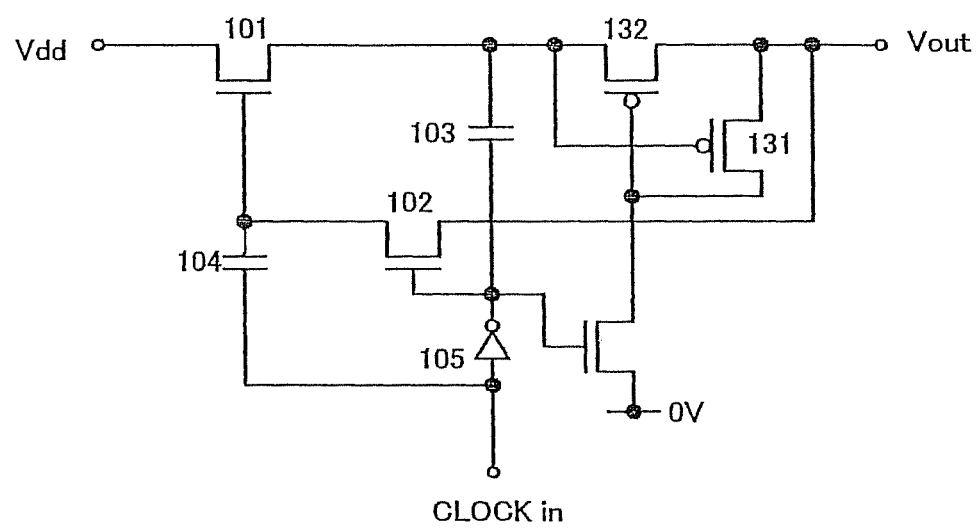
FIG. 22 is a circuit diagram showing a charge pump of the invention.

FIG. 22 shows a circuit configuration of a charge pump configured by the circuit shown in FIG. 1A that can be used for the first stage and the circuit shown in FIG. 7 that can be used for the second or later stage.

Figure 23:
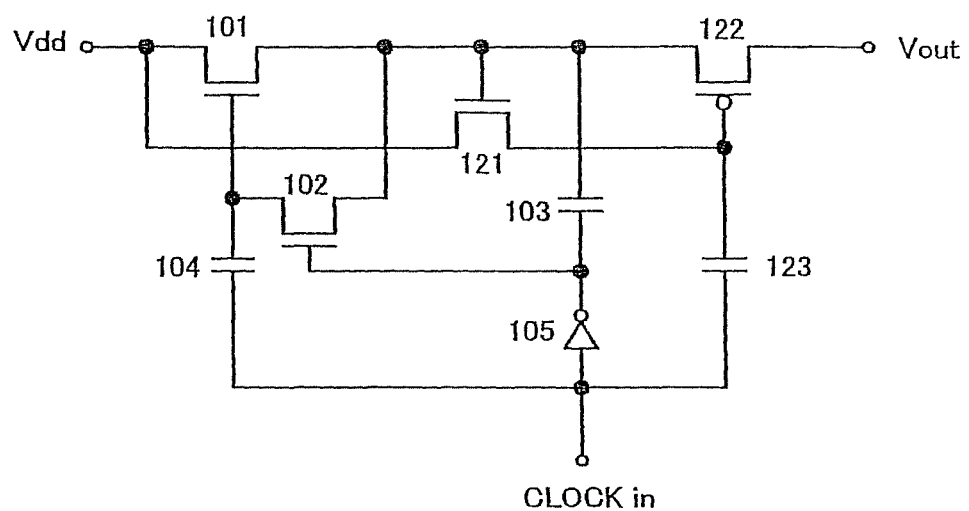
FIG. 23 is a circuit diagram showing a charge pump of the invention.

FIG. 23 shows a circuit configuration of a charge pump configured by the circuit shown in FIG. 2 that can be used for the first stage and the circuit shown in FIG. 4 that can be used for the second or later stage.

Figure 24:
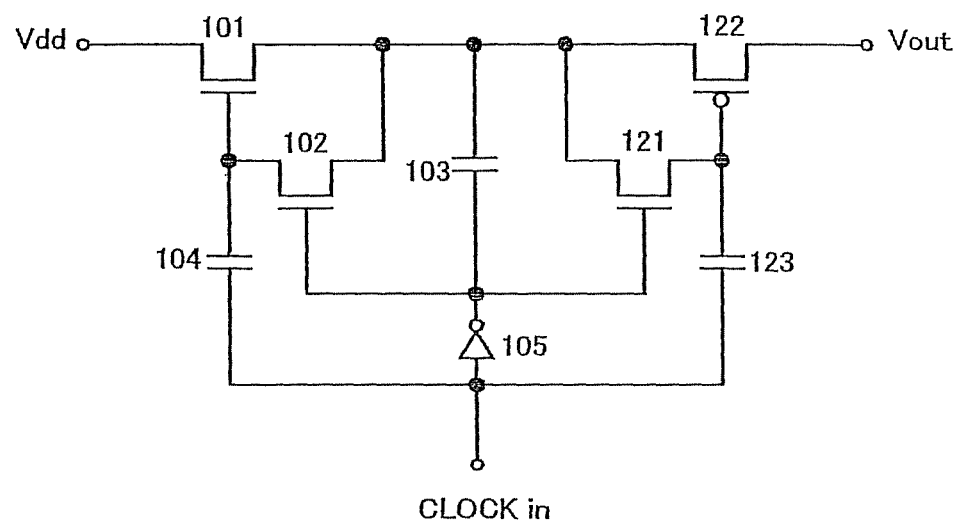
FIG. 24 is a circuit diagram showing a charge pump of the invention.

FIG. 24 shows a circuit configuration of a charge pump configured by the circuit shown in FIG. 2 that can be used for the first stage and the circuit shown in FIG. 5 that can be used for the second or later stage.

Figure 25:
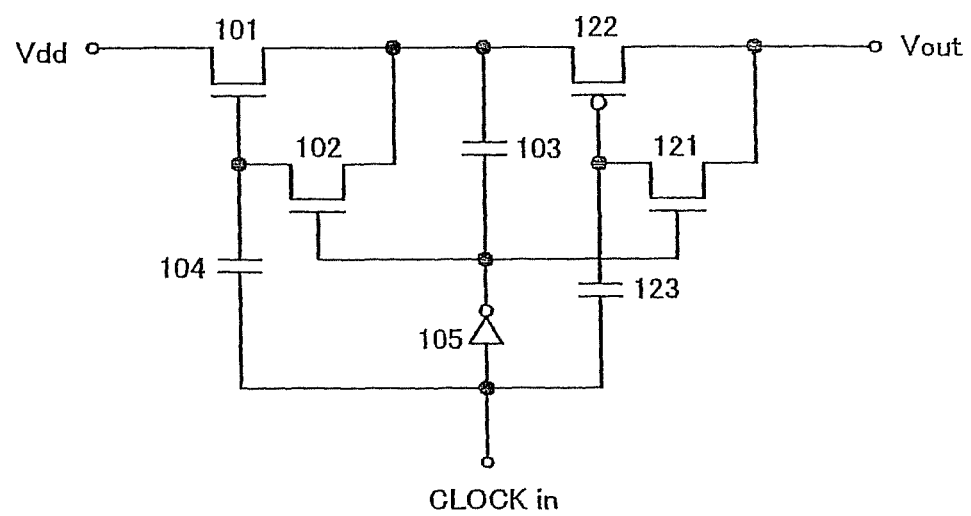
FIG. 25 is a circuit diagram showing a charge pump of the invention.

FIG. 25 shows a circuit configuration of a charge pump configured by the circuit shown in FIG. 2 that can be used for the first stage and the circuit shown in FIG. 6 that can be used for the second or later stage.

Figure 26:
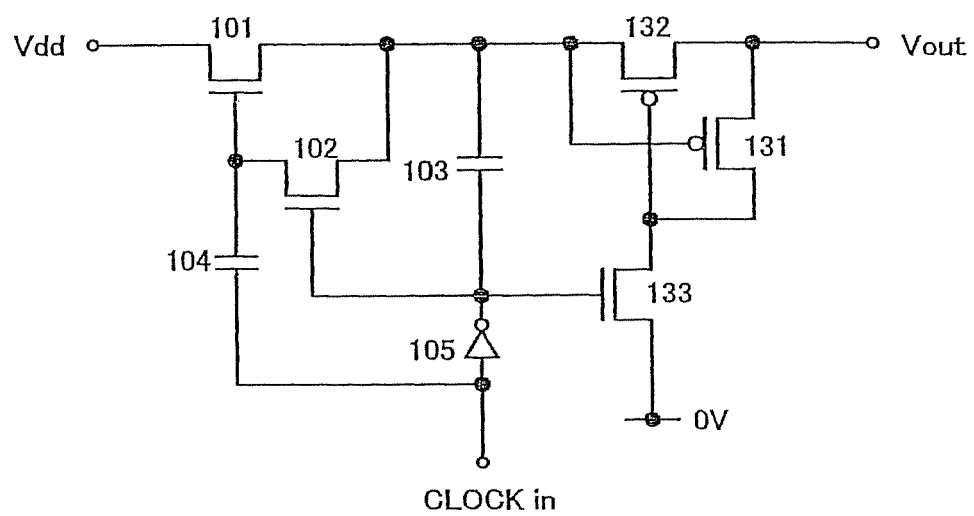
FIG. 26 is a circuit diagram showing a charge pump of the invention.

FIG. 26 shows a circuit configuration of a charge pump configured by the circuit shown in FIG. 2 that can be used for the first stage and the circuit shown in FIG. 7 that can be used for the second or later stage.

Figure 27:
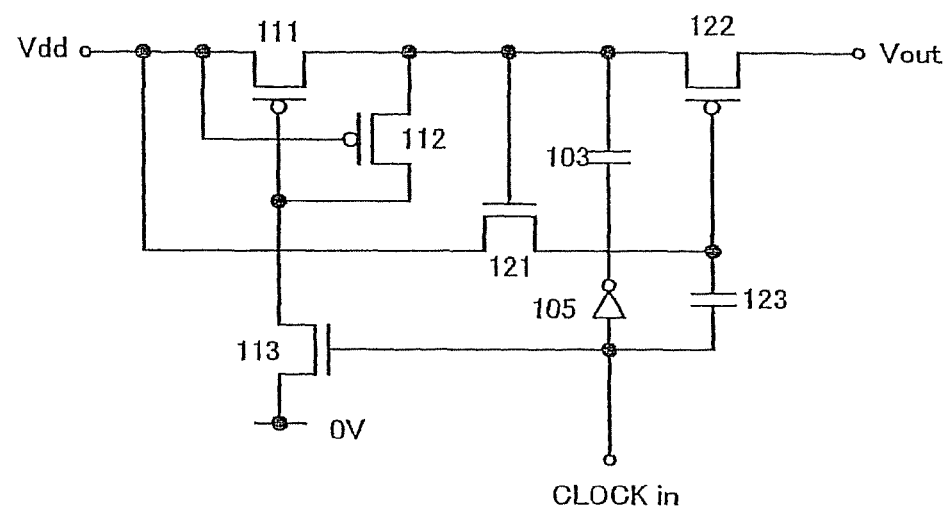
FIG. 27 is a circuit diagram showing a charge pump of the invention.

FIG. 27 shows a circuit configuration of a charge pump configured by the circuit shown in FIG. 3 that can be used for the first stage and the circuit shown in FIG. 4 that can be used for the second or later stage.

Figure 28:
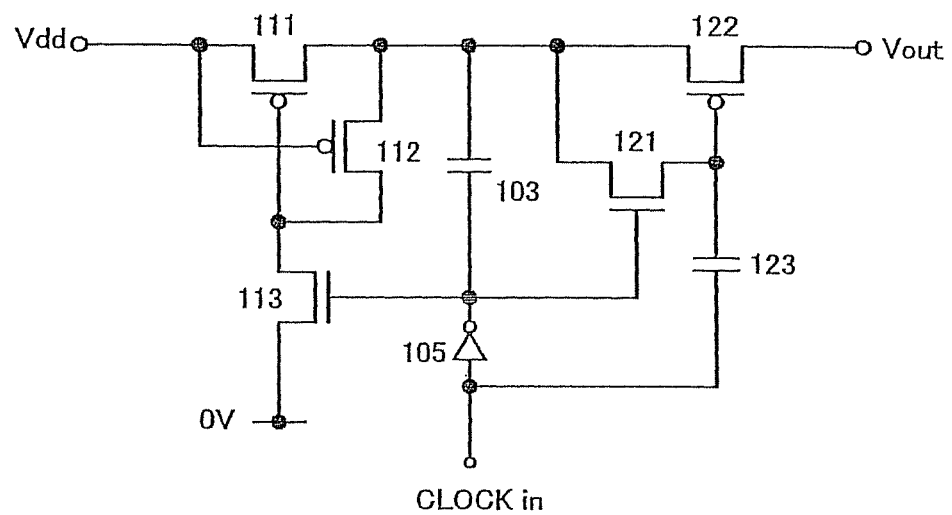
FIG. 28 is a circuit diagram showing a charge pump of the invention.

FIG. 28 shows a circuit configuration of a charge pump configured by the circuit shown in FIG. 3 that can be used for the first stage and the circuit shown in FIG. 5 that can be used for the second or later stage.

Figure 29:
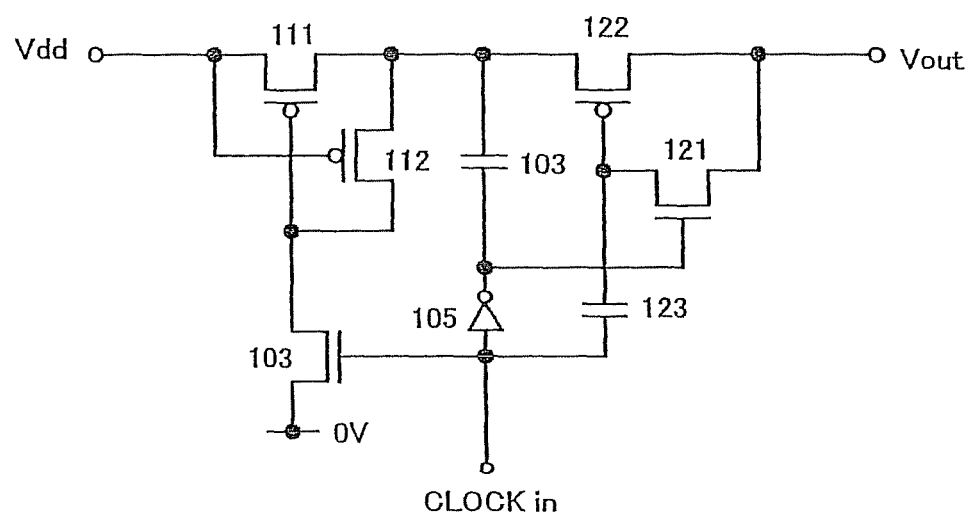
FIG. 29 is a circuit diagram showing a charge pump of the invention.

FIG. 29 shows a circuit configuration of a charge pump configured by the circuit shown in FIG. 3 that can be used for the first stage and the circuit shown in FIG. 6 that can be used for the second or later stage.

Figure 30:
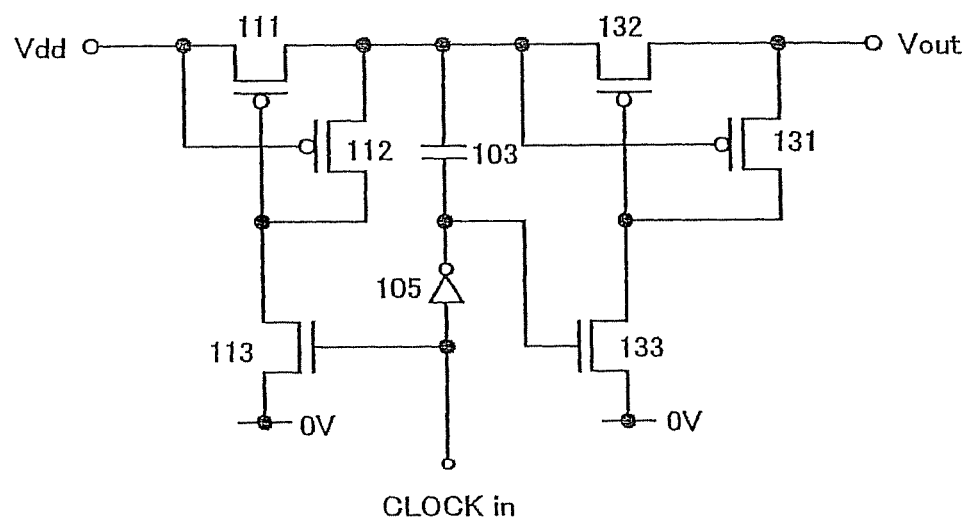
FIG. 30 is a circuit diagram showing a charge pump of the invention.

FIG. 30 shows a circuit configuration of a charge pump configured by the circuit shown in FIG. 3 that can be used for the first stage and the circuit shown in FIG. 7 that can be used for the second or later stage.

In this manner, the circuit used for the first stage and the circuit used for the second or later stage can be combined freely.

[Embodiment Mode 9]

Described in this embodiment mode are configuration and operation of the charge pump, which are different from those shown in Embodiment Modes 1 to 8. In this embodiment mode, a circuit configuration that can be used for the first stage as is in Embodiment Mode 1 is described, where one electrode of the first transistor is maintained at a low level potential of 0 V.

Figure 14:
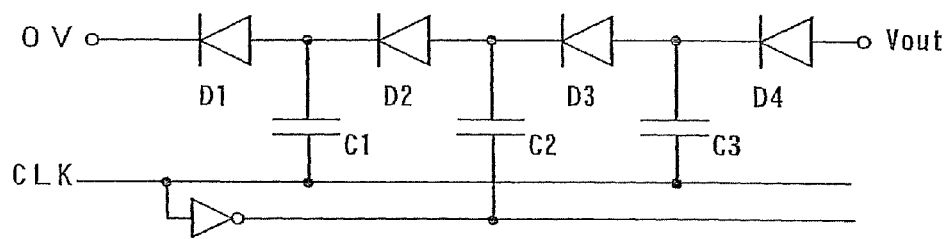
FIG. 14 is a circuit diagram showing a charge pump.

FIG. 14 shows a circuit configuration of a four-stage Dickson charge pump. The direction of the diode in FIG. 14 is reversed to that of the Dickson charge pump shown in FIG. 13. Accordingly, a high level potential at the negative side can be generated.

Figure 9:
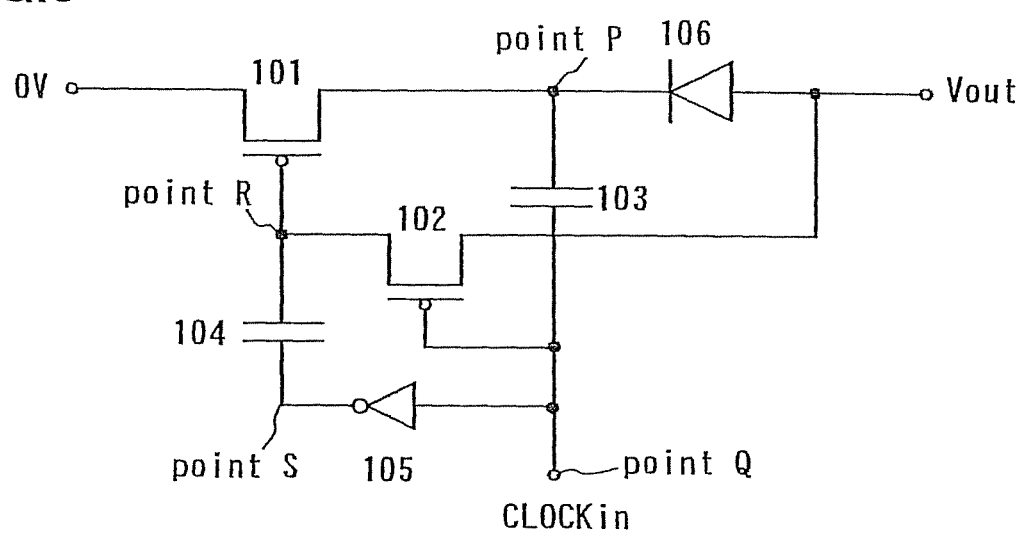
FIG. 9 is a circuit diagram showing a charge pump of the invention.

FIG. 9 shows a charge pump where the conductivity of the transistors and the direction of the diode 106 are opposite to those in FIG. 1A. The charge pump shown in FIG. 9 includes, as in FIG. 1A, the first transistor 101, the second transistor 102, the first capacitor element 103, the second capacitor element 104, the inverter 105, and the diode 106. The first transistor 101, the second transistor 102 and the second capacitor element 104 collectively function as the diode D1 in FIG. 13. The first capacitor element 103 in FIG. 9 corresponds to the capacitor element C1 in FIG. 14, and the diode 106 corresponds to the diode D2 in FIG. 14. It is assumed that a low level potential is 0 V for simplicity, though the invention is not limited to this. A high level potential is assumed to be Vdd. Accordingly, Vdd is inputted to and outputted from the inverter 105 as a high signal while 0 V is inputted to and outputted from the inverter 105 as a low signal. In this embodiment mode, the first transistor 101 and the second transistor 102 have P-type conductivity. The diode 106 may be any one of a PN diode, a PIN diode, a Schottky diode, and a diode connected transistor. If the diode connected transistor is used, it may have either N-type conductivity or P-type conductivity. The diode 106 may also have any circuit configuration.

The connection between each element and the operation thereof are similar to those in FIG. 1A except that one electrode of the first transistor 101 is connected to a power supply to be maintained at a low level potential of 0 V and the direction of the diode is reversed. Such a connection allows −VDD to be outputted to Vout.

The operation of the charge pump having such a configuration is described.

A clock signal with a high signal of Vdd and a low signal of 0 V is inputted to the input of the inverter 105 (point Q). If a low signal is inputted to the input of the inverter 105 (point Q), for example, a high signal is inputted to the second capacitor element 104 while a low signal is inputted to the gate electrode of the second transistor 102 and the first capacitor element 103. Since a high signal is inputted to the second capacitor element 104, the potential at the point R rises. Then, the second transistor 102 of which the gate electrode is at 0 V is turned on, and thus current flows from the point R to Vout. When the voltage between the point Q and the point R, namely the gate-source voltage of the second transistor 102 becomes equal to Vth of the second transistor 102, the second transistor 102 is turned off. Therefore, the potential at the point R is lower than that at the point Q by Vth (higher by |Vth|). Note that Vth is indicated by a negative value since the second transistor 102 has P-type conductivity. Thus, the potential at the point R is |Vth|(−Vth). The first transistor of which one electrode is at 0 V and the gate electrode is |Vth| is turned off. At this time, the diode 106 is turned on and the potential at the point P becomes equal to Vout.

When the next clock waveform, namely a high signal is inputted to the point Q, a high signal is inputted to the gate electrode of the second transistor 102 and the first capacitor element 103, while a low signal is inputted to the second capacitor element 104. Then, a charge of −Vdd corresponding to a low signal is accumulated in the second capacitor element 104 in addition to a predetermined charge that has been previously accumulated. Meanwhile, a charge of Vdd corresponding to a high signal is accumulated in the first capacitor element 103 in addition to a predetermined charge that has been previously accumulated. At this time, the second transistor 102 of which the gate electrode is at Vdd is turned off, thereby the charge in the second capacitor element 104 is held. Since 0 V is inputted to the point S, the potential at the point R drops by Vdd and becomes equal to |Vth|−Vdd. Thus, the potential at the gate electrode of the first transistor 101 (point R) becomes equal to |Vth|Vdd, thereby the first transistor 101 is turned on. As a result, the potential at the point P becomes 0 V and Vdd is inputted to the point Q, thus a charge of −Vdd is accumulated in the first capacitor element 103.

When the next clock waveform, namely a low signal is then inputted to the point Q, a high signal is inputted to the second capacitor element 104 while a low signal is inputted to the gate electrode of the second transistor 102 and the first capacitor element 103. The second transistor of which one electrode (Vout) is at −Vdd and the gate electrode is at 0 V is turned on. A predetermined charge is accumulated in the second capacitor element 104 until it becomes equal to the threshold voltage Vth of the second transistor 102. Thus, the potential at the point R becomes |Vth|. The first transistor 101 of which one electrode is at 0 V and the gate electrode is at |Vth| is turned off. The potential of the first capacitor element 103 (point P) drops by −Vdd corresponding to a low signal. At this time, the potential at the output of the diode 106 (point P) is lower that that at the input thereof (Vout), therefore, a predetermined current, namely a current of −Vdd is outputted to Vout and Vout is boosted.

By repeating such operation, the potential at Vout can be made −Vdd.

In the charge pump according to this embodiment mode also, voltage drop (voltage rise) due to the threshold voltage of the first transistor 101 can be prevented by the second capacitor element 104 and the second transistor 102.

In the aforementioned charge pump, thin film transistors can be used as the transistors. As a result, the charge pump can be formed integrally with a display device or a nonvolatile memory such as a flash memory. When thin film transistors are used in the charge pump, however, it is difficult to raise the potential to a predetermined level because of a high threshold voltage. In addition, variations in threshold voltages of thin film transistors may cause variations in potentials to be outputted. Meanwhile, when the charge pump according to this embodiment mode is used, voltage drop due to threshold voltage can be prevented by the second capacitor element 104 as described above. Therefore, the charge pump according to this embodiment mode is extremely effective in the case of using thin film transistors having a threshold voltage higher than transistors formed on a silicon wafer.

The charge pump including thin film transistors can be formed integrally with a pixel portion of a liquid crystal display device, a light emitting device and other display devices. At this time, either or both of the first capacitor element 103 and the second capacitor element 104 may be formed integrally with the display device. The integral formation with the display device allows reduction in the number of components. On the other hand, if the capacitor element is not formed integrally with the display device, the capacitance of the capacitor element can be increased. The first capacitor element 103 is required to have higher capacitance than the second capacitor element 104. Thus, the smaller second capacitor element 104 may be formed integrally with the display device, thereby the number of components is reduced and cost reduction is achieved. Meanwhile, the larger first capacitor element 103 may be formed separately from the display device, thereby the capacitance of the first capacitor element 103 can be increased.

In this manner, a circuit for dropping the voltage at Vout can be configured easily by making the conductivity of the transistors and the direction of the diode 106 opposite to the circuit for boosting Vout. Therefore, the circuits shown in FIGS. 2 and 3 can also be applied to a circuit for dropping the voltage.

Figure 31:
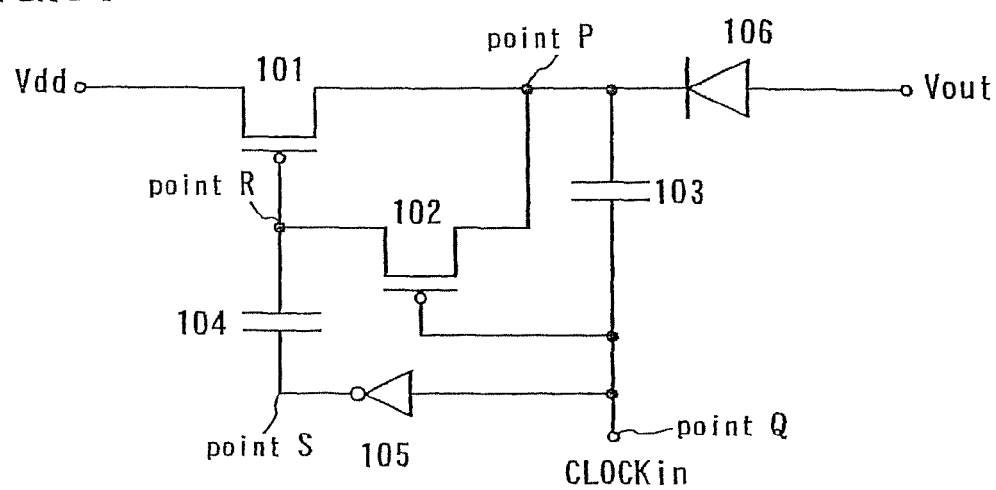
FIG. 31 is a circuit diagram showing a charge pump of the invention.
Figure 32:
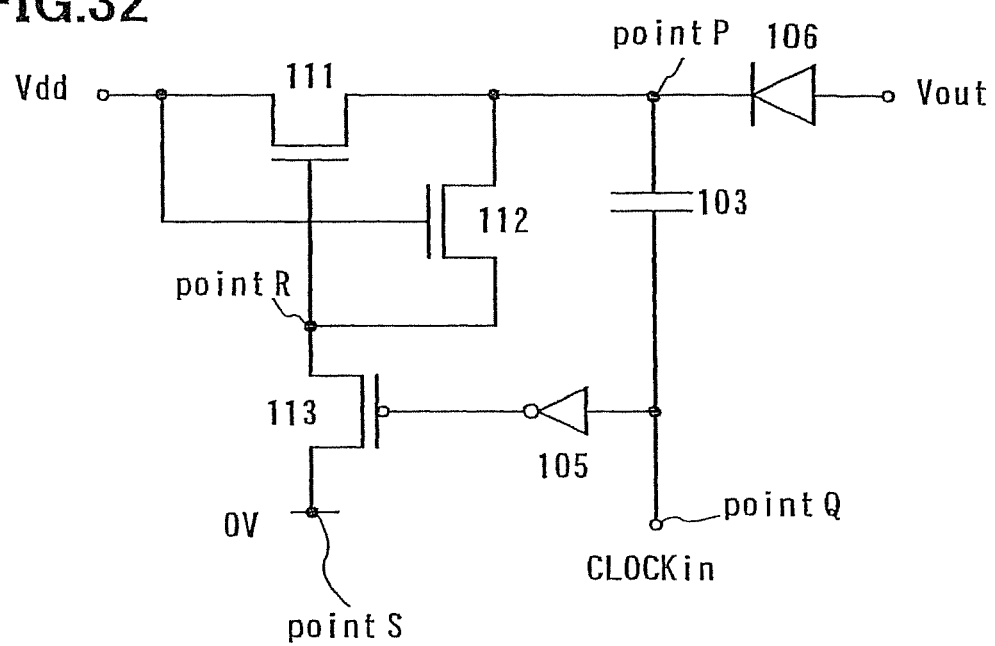
FIG. 32 is a circuit diagram showing a charge pump of the invention.

FIG. 31 shows a circuit configuration for dropping the voltage, which corresponds to FIG. 2. FIG. 32 shows a circuit configuration for dropping the voltage, which corresponds to FIG. 3.

These circuits for dropping the voltage can be obtained only by changing the conductivity of transistor and the direction of diode, thus, the circuit configurations described in Embodiment Modes 1 to 3 can be applied to the circuit for dropping the voltage.

[Embodiment Mode 10]

Described in this embodiment mode are configuration and operation of the charge pump, which are different from those shown in Embodiment Modes 1 to 9. In this embodiment mode, a circuit configuration that can be used for the second or later stage as is in Embodiment Mode is described, where one electrode of the first transistor is maintained at a low level potential of 0 V.

Figure 10:
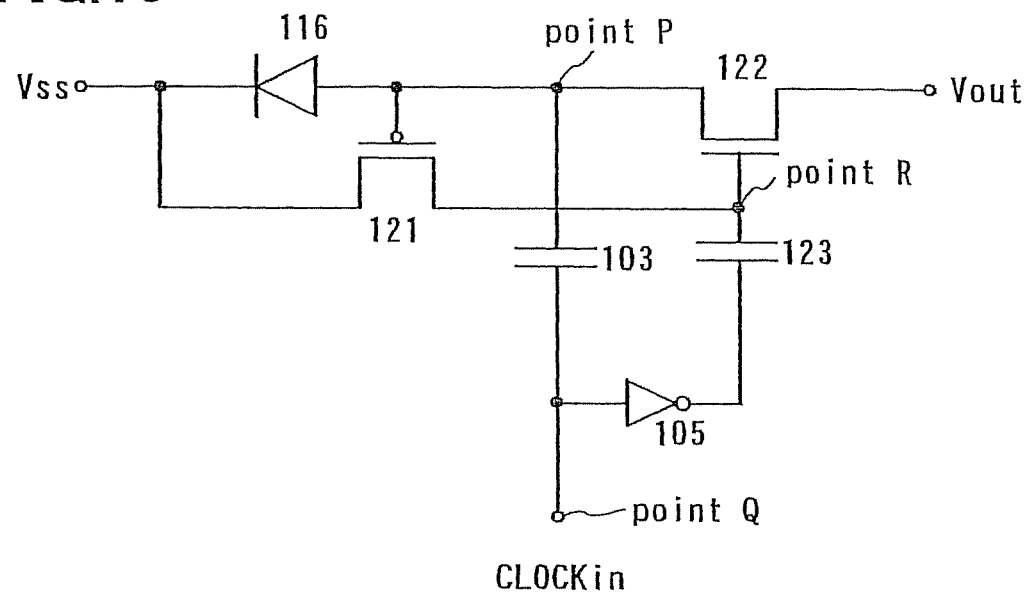
FIG. 10 is a circuit diagram showing a charge pump of the invention.

FIG. 10 shows a charge pump where the polarity of the transistors and the direction of the diode 116 are reversed to those in FIG. 4. The charge pump in FIG. 10 includes, as in FIG. 4, the first transistor 121, the second transistor 122, the first capacitor element 103, the second capacitor element 123, the inverter 105, and the diode 116. The capacitor element 103 in FIG. 10 corresponds to the capacitor element C1 in FIG. 14, and the diode 116 has a function corresponding to the diode D2 in FIG. 14. The first transistor 121, the second transistor 122 and the second capacitor element 123 collectively function as the diode D1 in FIG. 14. It is assumed that a low level potential is 0 V for simplicity, though the invention is not limited to this. A high level potential is assumed to be Vdd. Accordingly, Vdd is inputted to and outputted from the inverter 105 as a high signal while 0 V is inputted to and outputted from the inverter 105 as a low signal. In this embodiment mode, the first transistor 121 has P-type conductivity and the second transistor 122 has N-type conductivity. The diode 116 may be any one of a PN diode, a PIN diode, a Schottky diode, and a diode connected transistor. If the diode connected transistor is used, it may have either N-type conductivity or P-type conductivity. The diode 116 may also have any element configuration and circuit configuration.

The connection between each element and the operation thereof are similar to those in FIG. 4 except that one electrode of the first transistor 121 is connected to a power supply to be maintained at a low level potential of 0 V and the connection of the diode 116 is reversed. Therefore, the description is omitted in this embodiment mode.

In such a case, when a clock signal with a high signal of Vdd and a low signal of 0 V is inputted to the input of the inverter 105, a voltage of −Vdd is outputted to Vout.

In the charge pump according to this embodiment mode also, a predetermined charge can be outputted without being affected by voltage drop due to threshold voltage. That is, voltage drop due to the threshold voltage of the second transistor 122 can be prevented. The operation of this circuit is similar to that in FIG. 4, therefore the description thereof is omitted herein.

In the aforementioned charge pump, thin film transistors can be used as the transistors. As a result, the charge pump can be formed integrally with a display device or a nonvolatile memory such as a flash memory. When thin film transistors are used in the charge pump, however, it is difficult to raise the potential to a predetermined level because of a high threshold voltage. In addition, variations in threshold voltages of thin film transistors may cause variations in potentials to be outputted. Meanwhile, when the charge pump according to this embodiment mode is used, a predetermined charge can be outputted without being affected by voltage drop due to threshold voltage as described above. Therefore, the charge pump according to this embodiment mode is extremely effective in the case of using thin film transistors having a threshold voltage higher than transistors formed on a silicon wafer.

The charge pump including thin film transistors can be formed integrally with a pixel portion of a liquid crystal display device, a light emitting device and other display devices. At this time, either or both of the first capacitor element 103 and the second capacitor element 123 may be formed integrally with the display device. The integral formation with the display device allows reduction in the number of components. On the other hand, if the capacitor element is not formed integrally with the display device, the capacitance of the capacitor element can be increased. The first capacitor element 103 is required to have higher capacitance than the second capacitor element 123. Thus, the smaller second capacitor element 123 may be formed integrally with the display device, thereby the number of components is reduced and cost reduction is achieved. Meanwhile, the larger first capacitor element 103 may be formed separately from the display device, thereby the capacitance of the first capacitor element 103 can be increased.

In this manner, a circuit for dropping the voltage of Vout can be configured easily by making the conductivity of the transistors and the direction of the diode 116 opposite to the circuit for boosting Vout. Therefore, the circuits shown in FIGS. 5 to 7 can also be applied to a circuit for dropping the voltage.

Figure 33:
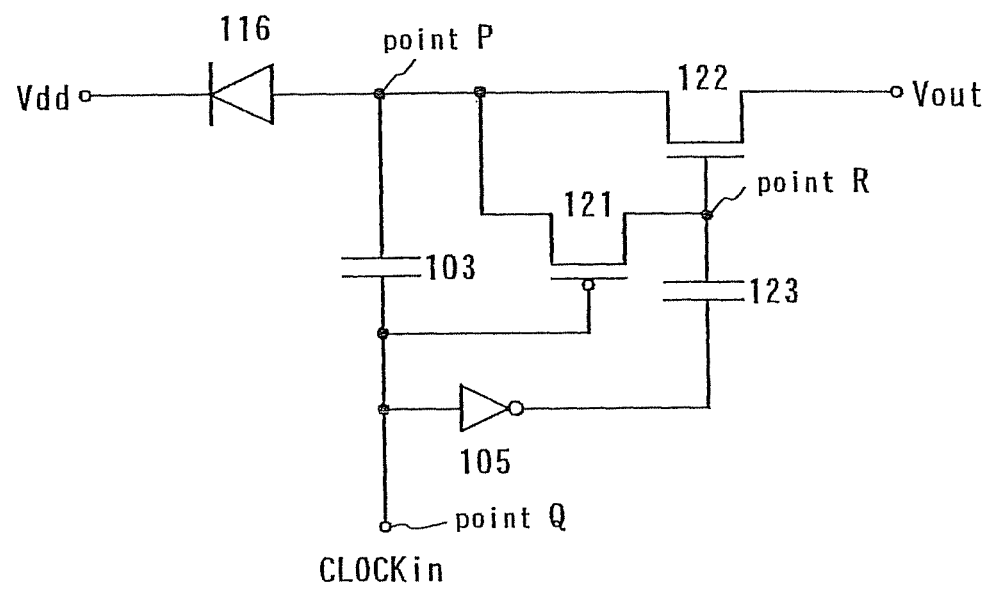
FIG. 33 is a circuit diagram showing a charge pump of the invention.
Figure 34:
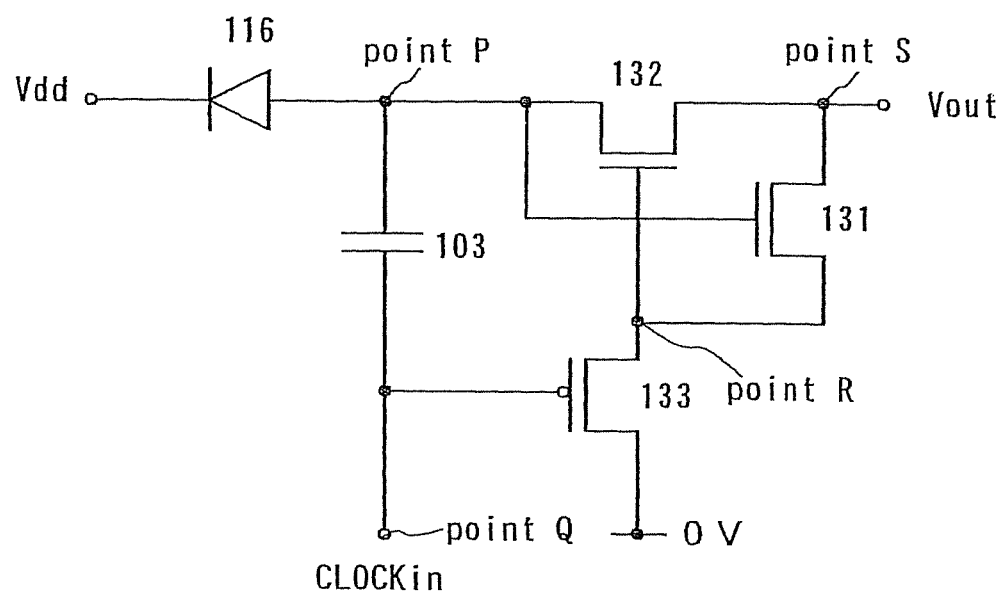
FIG. 34 is a circuit diagram showing a charge pump of the invention.

FIG. 33 shows a circuit configuration for dropping the voltage, which corresponds to FIG. 5. FIG. 34 shows a circuit configuration for dropping the voltage, which corresponds to FIG. 7.

These circuits for dropping the voltage can be obtained only by changing the conductivity of transistor and the direction of diode, thus, the circuit configurations described in Embodiment Modes 1 to 3 can be applied to the circuit for dropping the voltage.

[Embodiment Mode 11]

Described in this embodiment mode are configuration and operation of the charge pump where the circuit configuration described in Embodiment Mode 9 that can be used for the first stage is combined with the circuit configuration described in Embodiment Mode 10 that can be used for the second or later stage.

Figure 11:
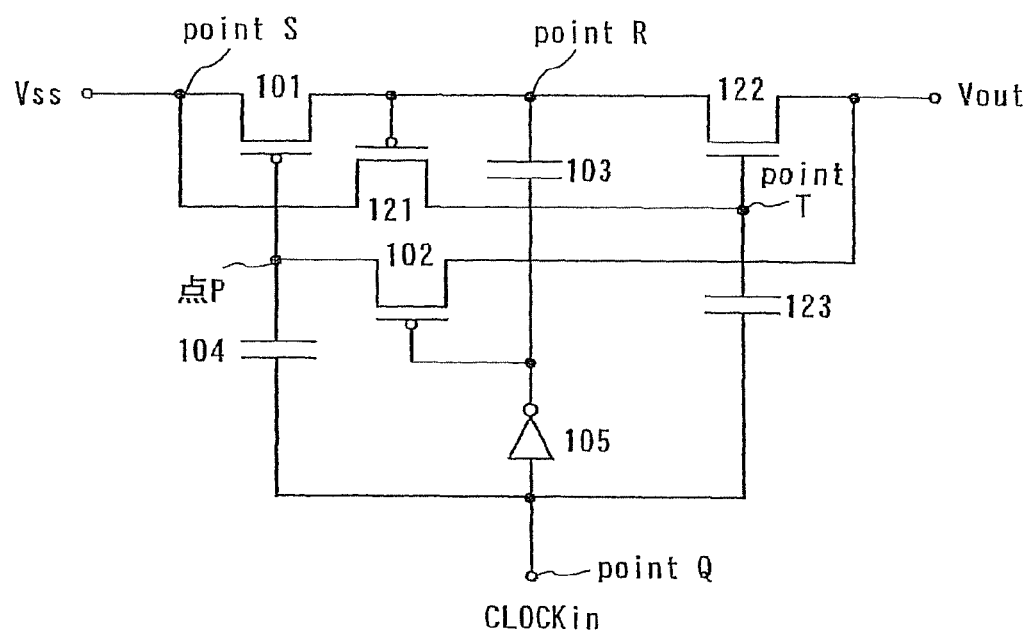
FIG. 11 is a circuit diagram showing a charge pump of the invention.

A charge pump shown in FIG. 11 includes, as in FIG. 8, the first transistor 101, the second transistor 102, the third transistor 121, the fourth transistor 122, the first capacitor element 103, the second capacitor element 104, the third capacitor element 123, and the inverter 105. In such a combined charge pump as shown in this embodiment mode, the inverter can be shared. The first capacitor element 103 in FIG. 11 corresponds to the capacitor element C1 in FIG. 14, and the first transistor 101, the second transistor 102 and the second capacitor element 104 have a function corresponding to the diode D1 in FIG. 14. The third transistor 121, the fourth transistor 122 and the third capacitor element 123 correspond to the diode D2 FIG. 13. It is assumed that a low level potential is 0 V for simplicity, though the invention is not limited to this. A high level potential is assumed to be Vdd. Accordingly, Vdd is inputted to and outputted from the inverter 105 as a high signal while 0 V is inputted to and outputted from the inverter 105 as a low signal. In this embodiment mode, the first to third transistors 101, 102 and 121 have P-type conductivity and the fourth transistor 122 has N-type conductivity.

The connection between each element and the operation thereof are similar to those in FIG. 8 except that one electrode of the first transistor 101 is connected to a power supply to be maintained at a low level potential of 0 V. Therefore, the description is omitted in this embodiment mode.

When a clock signal with a high signal of Vdd and a low signal of 0 V is inputted to the input of the inverter 105, −Vdd is outputted to Vout. That is, a charge corresponding to −Vdd is accumulated in the first capacitor element 103 and a current of −Vdd is outputted to Vout, thereby the voltage at Vout drops.

As set forth above, the circuit configurations described in Embodiment Modes 1 to 7 can be applied to a circuit for dropping the voltage by changing the conductivity of transistors and the like. Such a circuit for dropping the voltage can be configured by combining a circuit configuration that can be used for the first stage and a circuit configuration that can be used for the second or later stage. For example, the following charge pumps can be configured.

Figure 35:
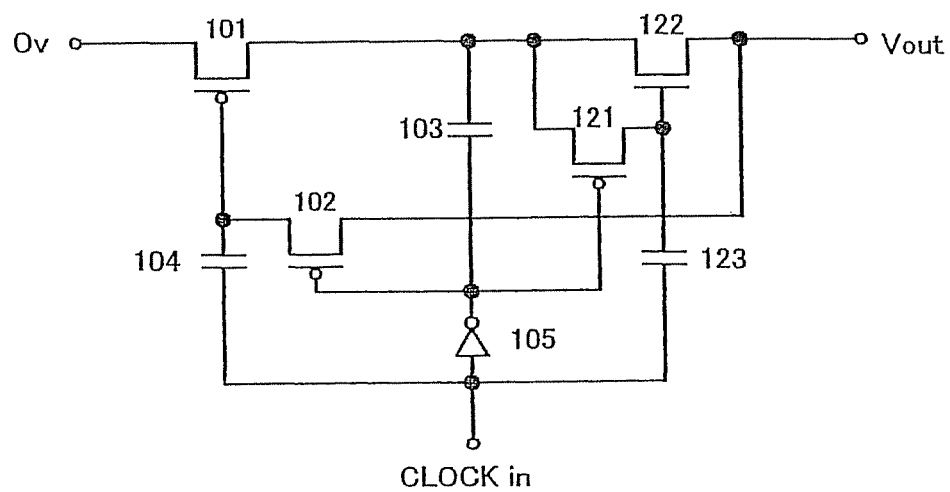
FIG. 35 is a circuit diagram showing a charge pump of the invention.

FIG. 35 shows a circuit configuration of a charge pump for dropping the voltage, which is obtained by changing the conductivity of transistors and the like of the circuit shown in FIG. 1A that can be used for the first stage and changing the conductivity of transistors and the like of the circuit shown in FIG. 5 that can be used for the second or later stage.

Figure 36:
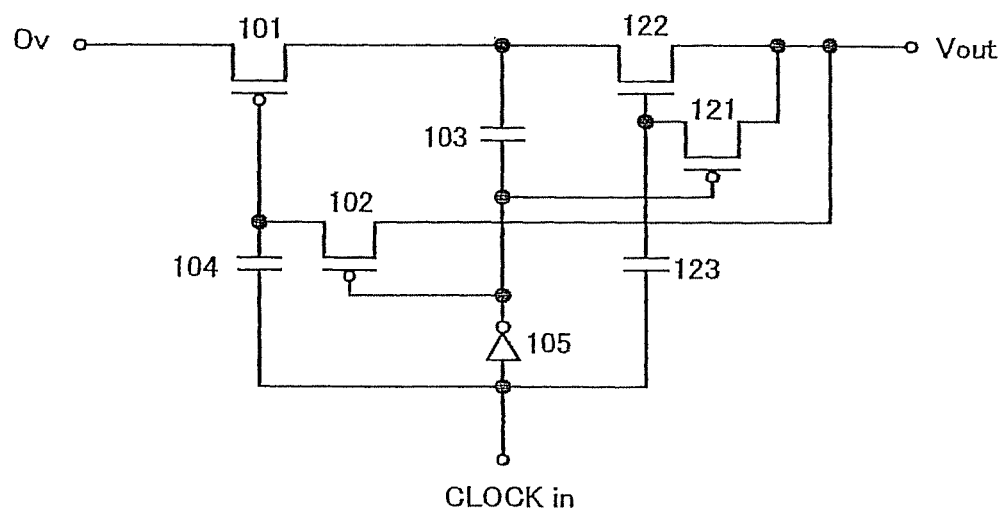
FIG. 36 is a circuit diagram showing a charge pump of the invention.

FIG. 36 shows a circuit configuration of a charge pump for dropping the voltage, which is obtained by changing the conductivity of transistors and the like of the circuit shown in FIG. 1A that can be used for the first stage and changing the conductivity of transistors and the like of the circuit shown in FIG. 6 that can be used for the second or later stage.

Figure 37:
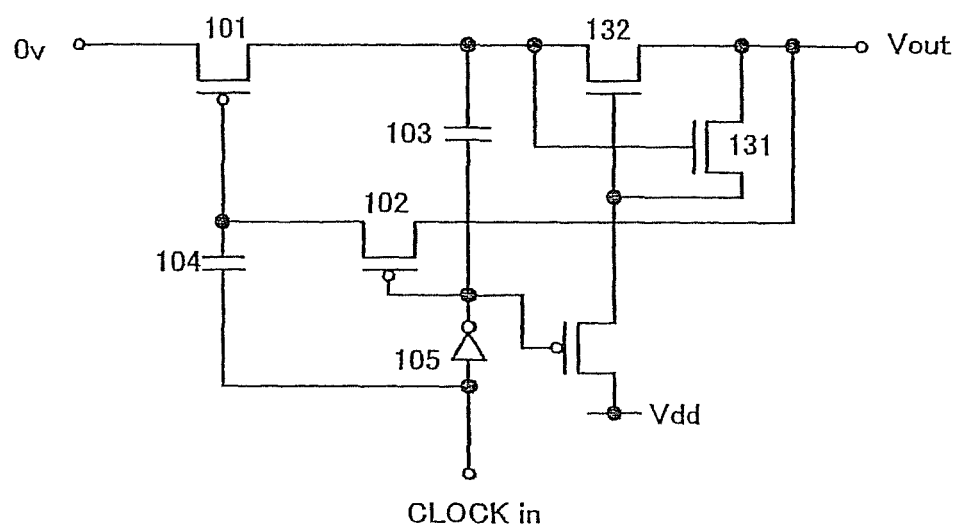
FIG. 37 is a circuit diagram showing a charge pump of the invention.

FIG. 37 shows a circuit configuration of a charge pump for dropping the voltage, which is obtained by changing the conductivity of transistors and the like of the circuit shown in FIG. 1A that can be used for the first stage and changing the conductivity of transistors and the like of the circuit shown in FIG. 7 that can be used for the second or later stage.

Figure 38:
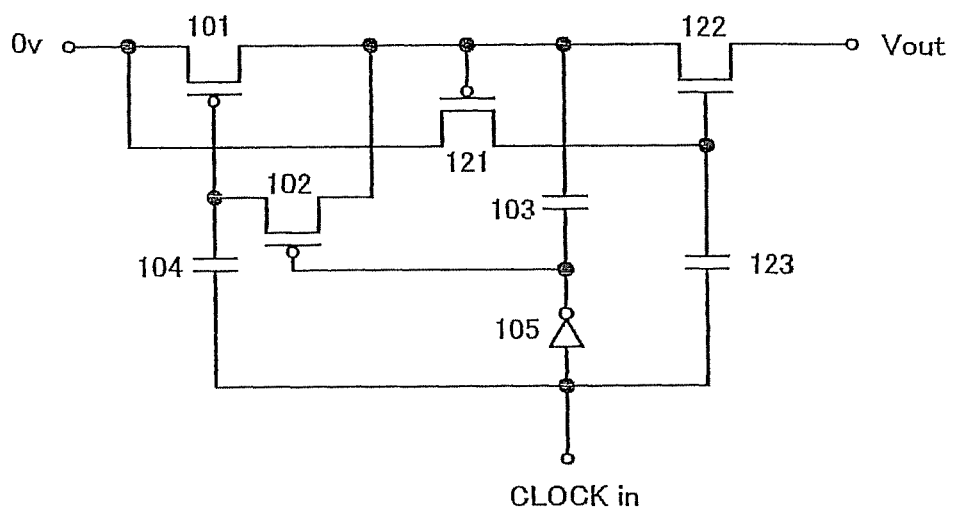
FIG. 38 is a circuit diagram showing a charge pump of the invention.

FIG. 38 shows a circuit configuration of a charge pump for dropping the voltage, which is obtained by changing the conductivity of transistors and the like of the circuit shown in FIG. 2 that can be used for the first stage and changing the conductivity of transistors and the like of the circuit shown in FIG. 4 that can be used for the second or later stage.

Figure 39:
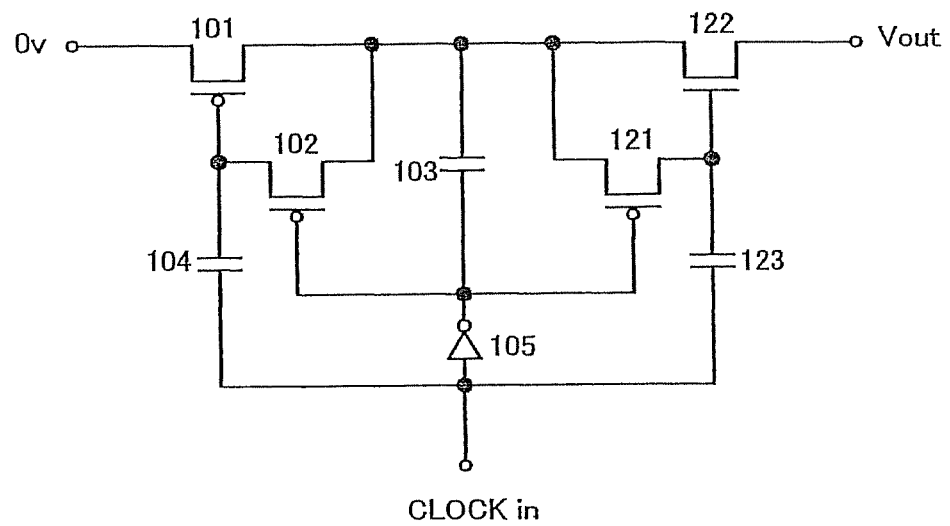
FIG. 39 is a circuit diagram showing a charge pump of the invention.

FIG. 39 shows a circuit configuration of a charge pump for dropping the voltage, which is obtained by changing the conductivity of transistors and the like of the circuit shown in FIG. 2 that can, be used for the first stage and changing the conductivity of transistors and the like of the circuit shown in FIG. 5 that can be used for the second or later stage.

Figure 40:
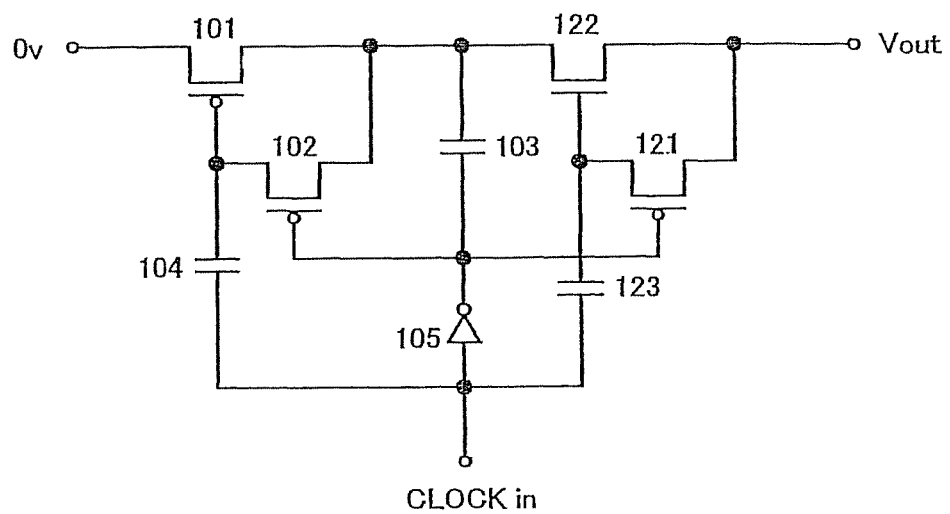
FIG. 40 is a circuit diagram showing a charge pump of the invention.

FIG. 40 shows a circuit configuration of a charge pump for dropping the voltage, which is obtained by changing the conductivity of transistors and the like of the circuit shown in FIG. 2 that can be used for the first stage and changing the conductivity of transistors and the like of the circuit shown in FIG. 6 that can be used for the second or later stage.

Figure 41:
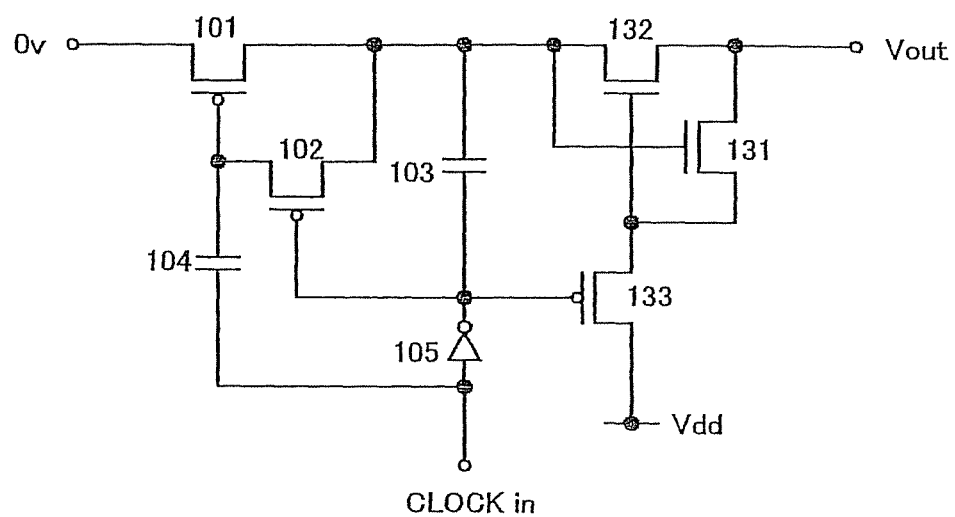
FIG. 41 is a circuit diagram showing a charge pump of the invention.

FIG. 41 shows a circuit configuration of a charge pump for dropping the voltage, which is obtained by changing the conductivity of transistors and the like of the circuit shown in FIG. 2 that can be used for the first stage and changing the conductivity of transistors and the like of the circuit shown in FIG. 7 that can be used for the second or later stage.

Figure 42:
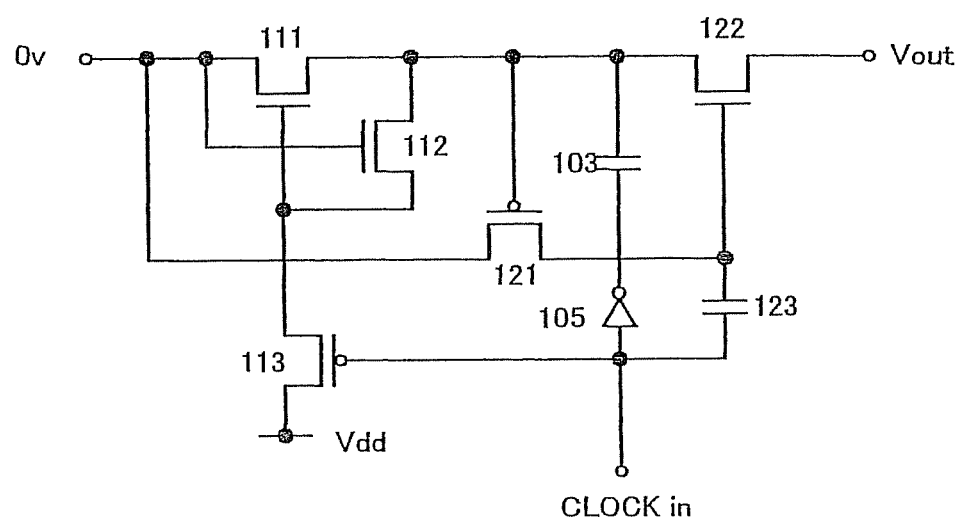
FIG. 42 is a circuit diagram showing a charge pump of the invention.

FIG. 42 shows a circuit configuration of a charge pump for dropping the voltage, which is obtained by changing the conductivity of transistors and the like of the circuit shown in FIG. 3 that can be used for the first stage and changing the conductivity of transistors and the like of the circuit shown in FIG. 4 that can be used for the second or later stage.

Figure 43:
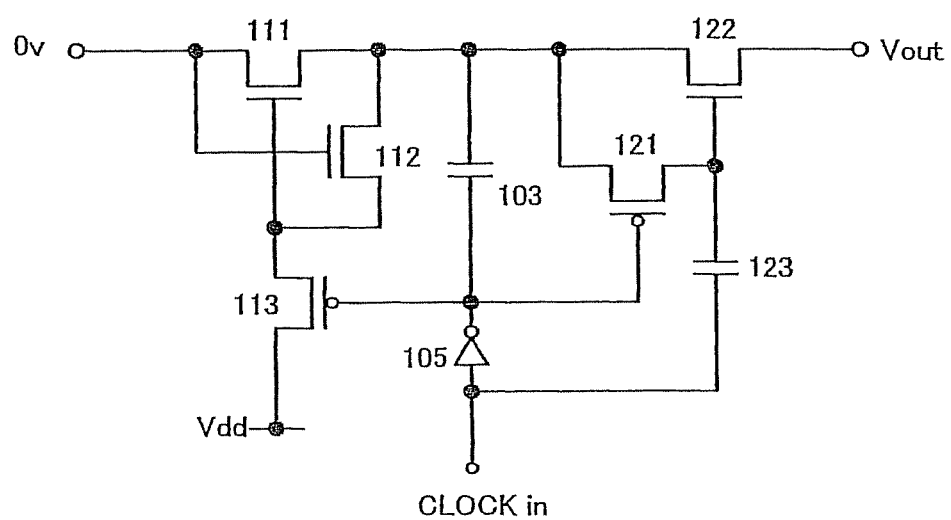
FIG. 43 is a circuit diagram showing a charge pump of the invention.

FIG. 43 shows a circuit configuration of a charge pump for dropping the voltage, which is obtained by changing the conductivity of transistors and the like of the circuit shown in FIG. 3 that can be used for the first stage and changing the conductivity of transistors and the like of the circuit shown in FIG. 5 that can be used for the second or later stage.

Figure 44:
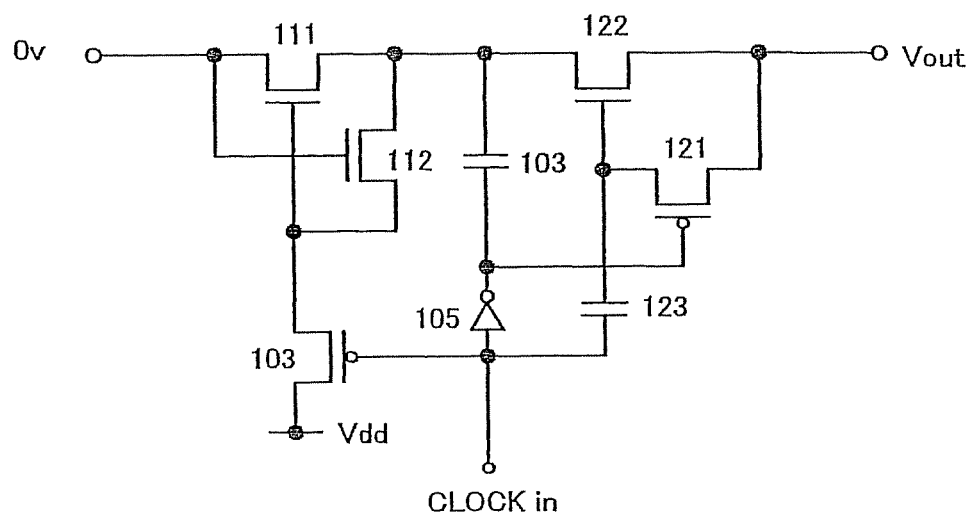
FIG. 44 is a circuit diagram showing a charge pump of the invention.

FIG. 44 shows a circuit configuration of a charge pump for dropping the voltage, which is obtained by changing the conductivity of transistors and the like of the circuit shown in FIG. 3 that can be used for the first stage and changing the conductivity of transistors and the like of the circuit shown in FIG. 6 that can be used for the second or later stage.

Figure 45:
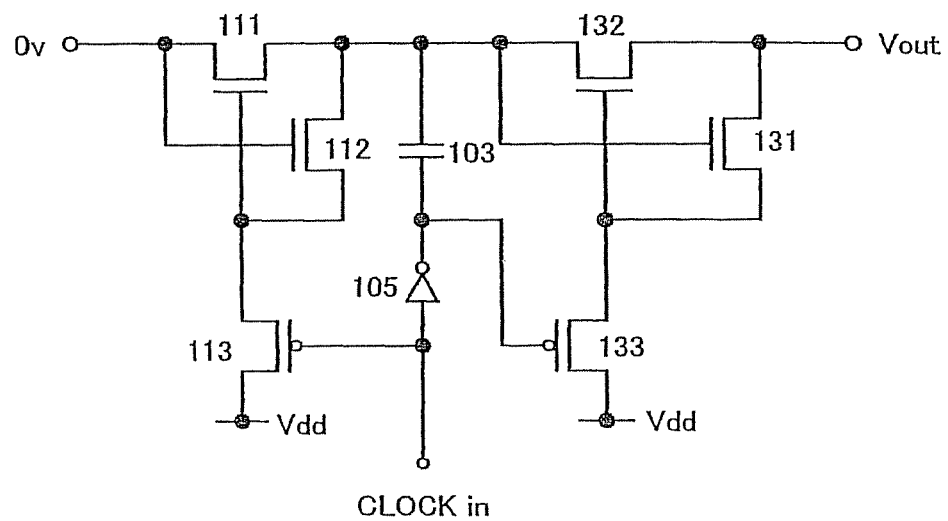
FIG. 45 is a circuit diagram showing a charge pump of the invention.

FIG. 45 shows a circuit configuration of a charge pump for dropping the voltage, which is obtained by changing the conductivity of transistors and the like of the circuit shown in FIG. 3 that can be used for the first stage and changing the conductivity of transistors and the like of the circuit shown in FIG. 7 that can be used for the second or later stage.

In this manner, the circuit used for the first stage and the circuit used for the second or later stage can be combined freely.

Figure 46:
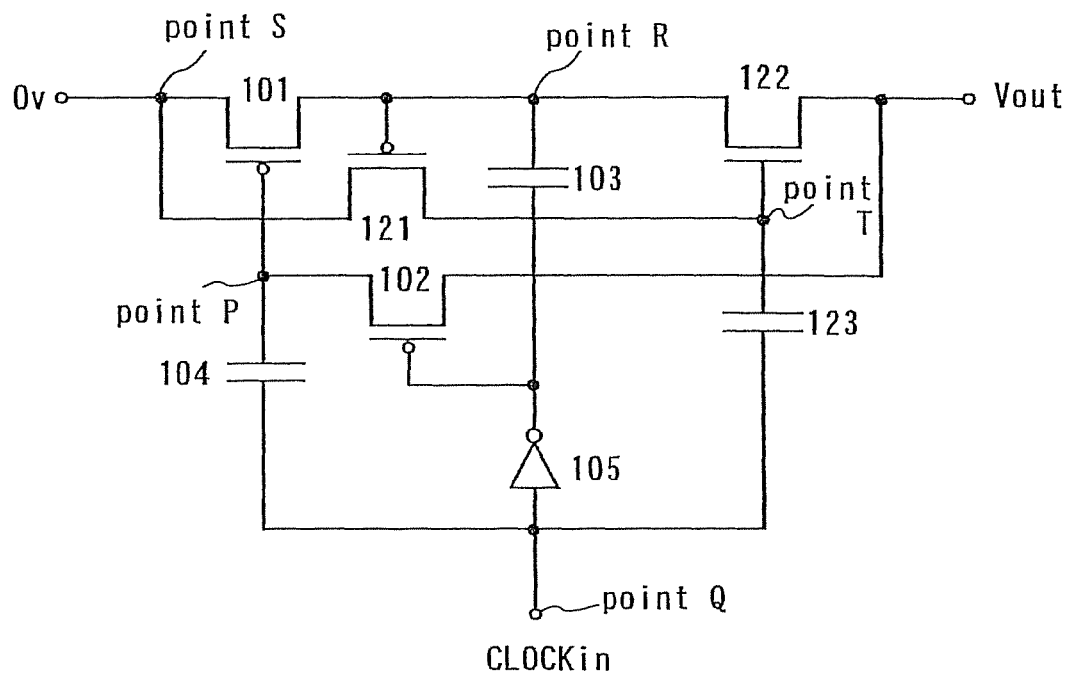
FIG. 46 is a circuit diagram showing a charge pump of the invention.

FIG. 46 shows a circuit configuration of the charge pump shown in FIG. 8, which is applied to a circuit configuration for dropping the voltage.

In the charge pump according this embodiment mode, a predetermined charge can be outputted to Vout independently of the threshold voltage (Vth) of the first transistor 101 and the fourth transistor 122. That is, in the charge pimp according to this embodiment mode, a predetermined charge can be accumulated without being affected by voltage drop due to the threshold voltage of the first transistor 101 and the fourth transistor 122.

In the aforementioned charge pump, thin film transistors can be used as the transistors. As a result, the charge pump can be formed integrally with a display device or a nonvolatile memory such as a flash memory. When thin film transistors are used in the charge pimp, however, it is difficult to raise the potential to a predetermined level because of a high threshold voltage. In addition, variations in threshold voltages of thin film transistors may cause variations in potentials to be outputted. Meanwhile, when the charge pump according to this embodiment mode is used, a predetermined charge can be outputted without being affected by voltage drop due to threshold voltage as described above. Therefore, the charge pump according to this embodiment mode is extremely effective in the case of using thin film transistors having a threshold voltage higher than transistors formed on a silicon wafer.

The charge pimp including thin film transistors can be formed integrally with a pixel portion of a liquid crystal display device, a light emitting device and other display devices. At this time, either or both of the first capacitor element 103 and the second capacitor element 104 may be formed integrally with the display device. The integral formation with the display device allows reduction in the number of components. On the other hand, if the capacitor element is not formed integrally with the display device, the capacitance of the capacitor element can be increased. The first capacitor element 103 is required to have higher capacitance than the second capacitor element 104. Thus, the smaller second capacitor element 104 may be formed integrally with the display device, thereby the number of components is reduced and cost reduction is achieved. Meanwhile, the larger first capacitor element 103 may be formed separately from the display device, thereby the capacitance of the first capacitor element 103 can be increased.

A charge pump can be configured by combining the aforementioned circuits for dropping the voltage.

[Embodiment Mode 12]

As an example of a semiconductor device including a charge pump, a configuration of a display device typified by a liquid crystal display device and a light emitting device having self luminous elements is described in this embodiment mode.

Figure 12:
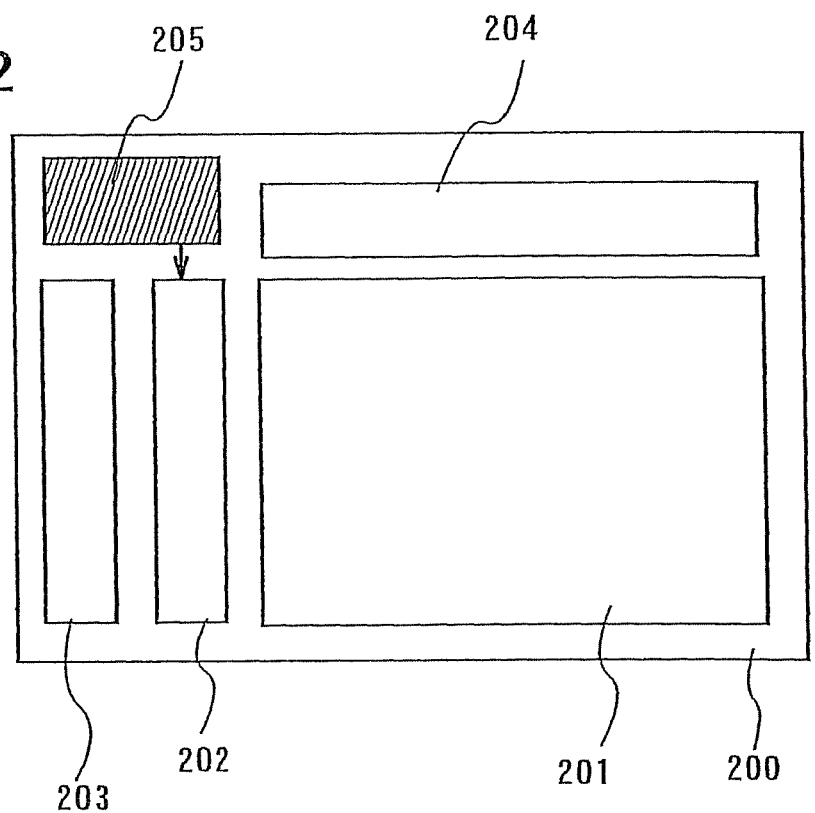
FIG. 12 is a diagram showing a display device having a charge pump of the invention.

In a panel portion of a display device shown in FIG. 12, a pixel portion 201, a level shifter 202, a gate driver 203, a source driver 204, and a charge pump 205 are formed on a substrate 200. If a power supply voltage inputted from a power supply is lower than a voltage required for elements in the pixel portion 201, the power supply voltage is boosted by the charge pump 205 to be supplied to the level shifter 202.

In the case where the charge pump is formed by using thin film transistors, a capacitor of the charge pump can be formed by a gate electrode and an impurity-doped semiconductor film provided with a gate insulating film interposed therebetween.

The charge pump including thin film transistors can be formed integrally in the pixel portion of a liquid crystal display device, a light emitting device and other display devices. As a result, the clock frequency of a switching element using the charge pump can be selected depending on a display mode, resulting in lower power consumption.

When using thing film transistors, a semiconductor may be selected from an amorphous semiconductor, a semi-amorphous semiconductor (also referred to as SAS) having an intermediate state between an amorphous semiconductor and a crystalline semiconductor, a microcrystalline semiconductor where crystal grains of 0.5 to 20 nm in size can be observed in an amorphous semiconductor, and a crystalline semiconductor. In particular; a microcrystalline state having crystal grains of 0.5 to 20 nm in size is called microcrystal (μc).

In this embodiment mode, a thin film transistor may adopt either a top gate structure where a gate electrode is formed over a semiconductor film or a bottom gate structure where a gate electrode is formed under a semiconductor film.

[Embodiment Mode 13]

Described in this embodiment mode is a circuit for stabilizing an output potential from a charge pump circuit, namely a stabilizing power supply circuit (regulator).

In the simplest case, a large capacitor element is disposed at the output of a charge pump. This large capacitor element suppresses potential changes and stabilizes the potential.

The large capacitor element may be formed integrally with a display device, or formed in another element. The integral formation with the display device allows reduction in the number of components. On the other hand, if the capacitor element is not formed integrally with the display device, the capacitance of the capacitor element can be increased.

Another stabilizing power supply circuit monitors an output potential from a charge pump and controls the operation of a clock signal supplied to the charge pump so as to make the voltage constant.

That is, a clock pulse (CLK) and an inverted clock pulse (CLKB) does not always have to be inputted to the charge pump circuit, and the input thereof may be stopped, for example, when the potential at the output terminal reaches a certain level.

Figure 16:
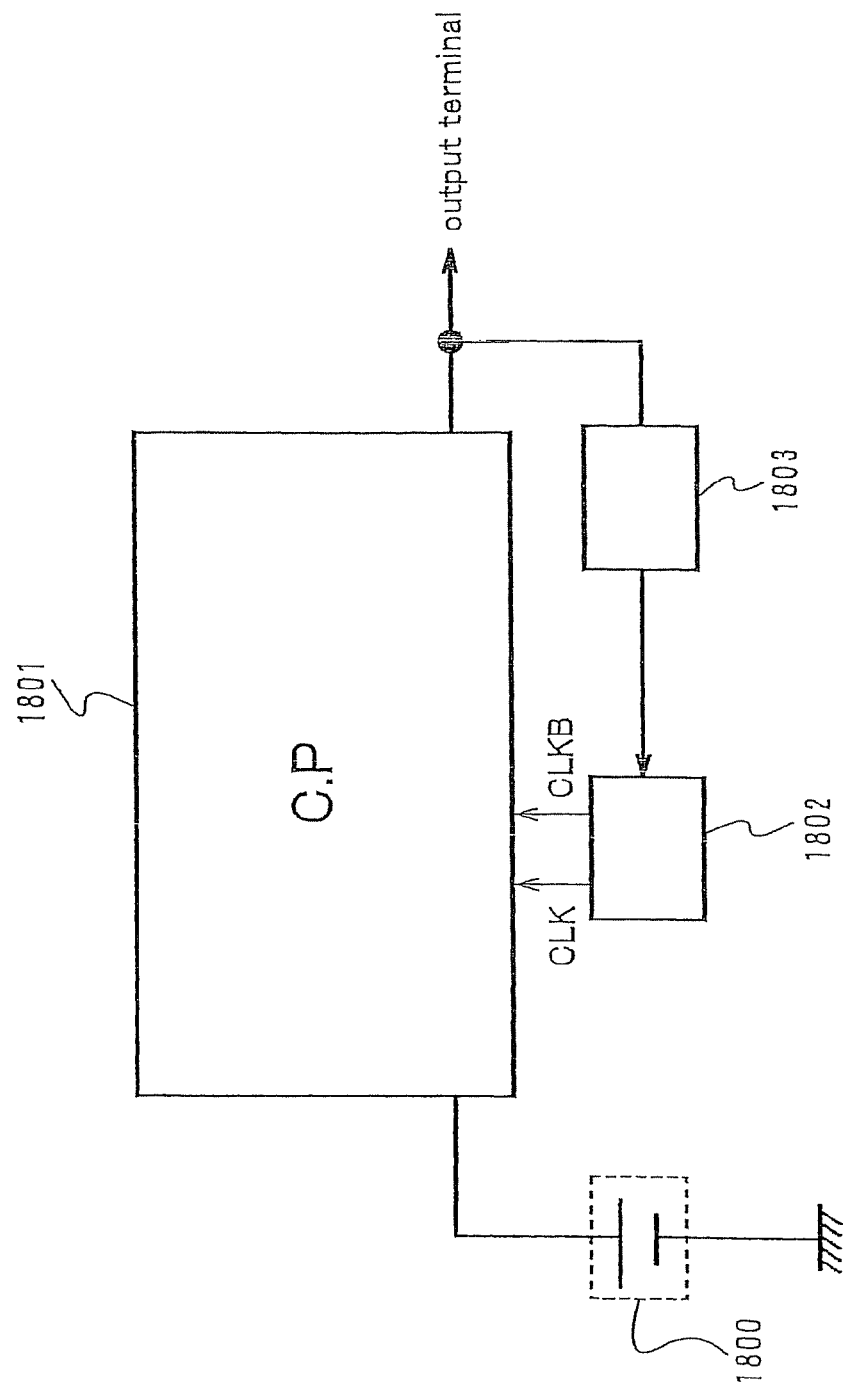
FIG. 16 is a diagram showing a regulator having a charge pump of the invention.

FIG. 16 is a schematic view showing a configuration in the case of stopping the input of a clock pulse (CLK) or an inverted clock pulse (CLKB).

A voltage of Vdd is supplied to an input terminal of a charge pump 1801 from a constant voltage source 1800, and a boosted voltage can be obtained at an output terminal thereof. A potential detecting circuit 1803 detects the potential at the output terminal and outputs a control signal when the potential reaches a certain level, thereby the input of a clock pulse (CLK) or an inverted clock pulse (CLKB) from a clock pulse generation circuit 1802 is stopped.

When a clock pulse is supplied, the output potential of the charge pump rises. Meanwhile, potential rise is stopped when a clock signal is not supplied. An output potential is controlled by utilizing this operation.

Accordingly, the potential can be stabilized and a predetermined potential can be outputted.

Figure 17A:
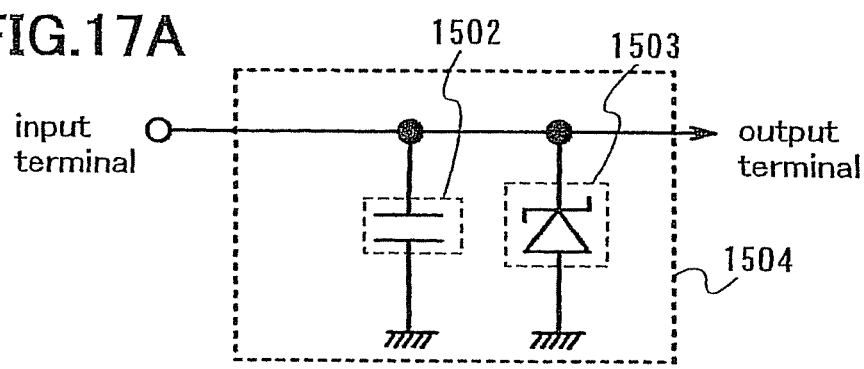
FIGS. 17A and 17B are diagrams showing a regulator having a charge pump of the invention.
Figure 17B:
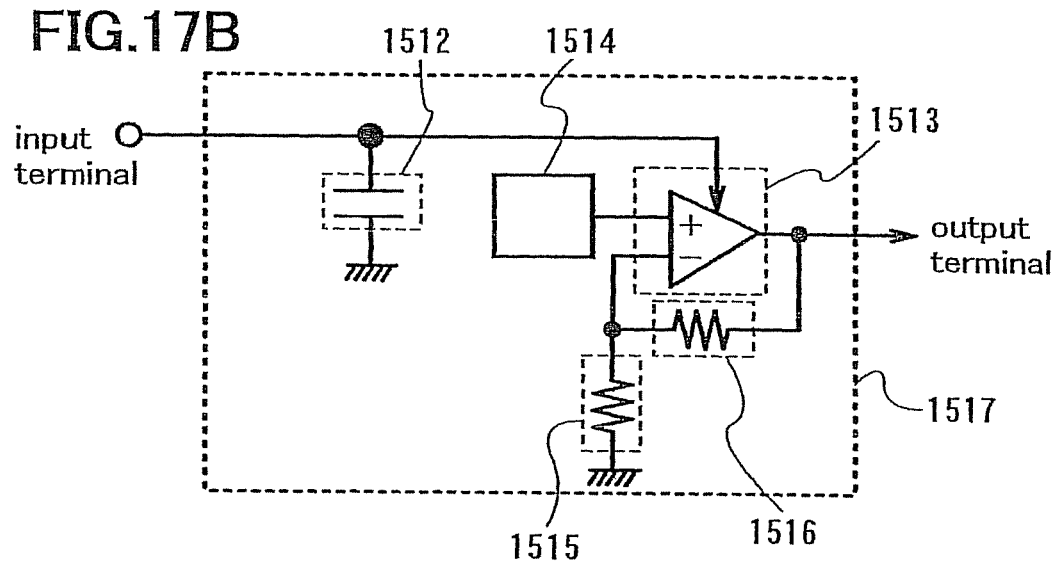

A configuration example of another stabilizing power supply circuit (regulator) is shown in FIGS. 17A and 17B.

The configuration in FIG. 17A is described. An input terminal in FIG. 17A is connected to an output terminal of a charge pump circuit. That is, before outputting a voltage, the output terminal of the charge pump is connected to one terminal of a zener diode 1503 of which the other terminal is connected to GND. Thus, current flows in the zener diode 1503 when an output potential reaches a certain level, and the potential at the output terminal can be controlled.

A stabilizing power supply circuit 1504 includes a capacitor element 1502 and the zener diode 1503.

As the capacitor element 1502, a capacitor element with large electrostatic capacitance is employed. Accordingly, the voltage between two electrodes of the capacitor element 1502 can be maintained constant, and a constant potential can be outputted to the output terminal of the stabilizing power supply circuit 1504.

The number of the zener diode 1503 is not limited to one, and a plurality of zener diodes may be arranged in series to control the potential. For example, a plurality of zener diodes may be arranged in accordance with the potential. Alternatively, zener diodes with different breakdown potentials may be connected in series to control the potential.

A stabilizing power supply circuit 1517 shown in FIG. 17B is described hereinafter.

The stabilizing power supply circuit 1517 includes a capacitor element 1512, an amplifier 1513, a first resistor 1515, and a second resistor 1516.

The voltage between two electrodes of the capacitor element 1512 is used as a power supply of the amplifier 1513. A constant voltage is inputted to a non-inverting input terminal of the amplifier 1513 from a reference power supply 1514. An inverting input terminal of the amplifier 1513 is connected to an output terminal through the second resistor 1516 and connected to a ground power supply GND through the first resistor 1515. As the amplifier 1513, a high gain amplifier is employed.

An output voltage of the amplifier 1513 is resistance-divided by the second resistor 1516 and the first resistor 1515, and then inputted to the inverting input terminal. This voltage value is compared with a voltage value inputted to the non-inverting input terminal from the reference power supply 1514 by the amplifier 1513.

An output voltage $V_0$ of the amplifier 1513 is represented by the following formula 1, provided that the voltage of the reference power supply 1514 is $V_r$, the resistance value of the first resistor 1515 is $R_1$ and the resistance value of the second resistor 1516 is $R_2$.

$$V_0 = V_r \frac{R_1 + R_2}{R_1} \quad \text{[Formula 1]}$$

Consequently, the output potential of the amplifier 1513 can be controlled by the ratio $R_2/R_1$ between the resistance values of the first resistor 1515 and the second resistor 1516. That is, the potential at the output terminal of the stabilizing power supply circuit 1517 can be selected arbitrarily from the potential of the reference power supply 1514 to a high level potential inputted to the input terminal of the stabilizing power supply circuit 1517.

The potential may be outputted from first to fourth output terminals through a smoothing circuit instead of the regulator.

Alternatively, a means for detecting an output potential before obtaining an output at the output terminal may be provided. In that case, input of a clock signal (CLK) or an inverted clock signal (CLKB) to a second electrode of a capacitor element may be stopped when the potential reaches a predetermined level.

[Embodiment Mode 14]

A display device using the charge pump of the invention can be applied to electronic apparatuses such as a video camera, a digital camera, a goggle type display (head mounted display), a navigation system, an audio reproducing device (car audio set, audio component and the like), a notebook computer, a game machine, a portable information terminal (mobile computer, mobile phone, portable game machine, electronic book and the like), and an image reproducing device provided with a recording medium (specifically, a device that reproduces a recording medium such as DVD (Digital Versatile Disc) and includes a display for displaying the reproduced image). In particular, a portable information terminal that includes a screen usually seen from an angle and thus requires a wide viewing angle is desirably equipped with the display device. Specific examples of these electronic apparatuses are shown in FIGS. 15A to 15H.

Figure 15A:
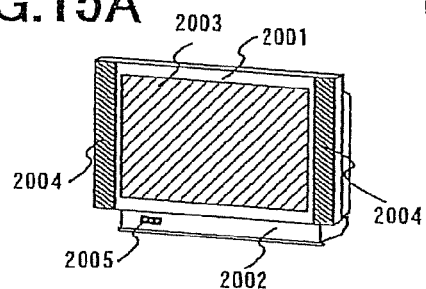
FIGS. 15A to 15H are views each showing an electronic apparatus having a charge pump of the invention.

FIG. 15A shows a display device that includes a housing 2001, a supporting base 2002, a display portion 2003, speaker portions 2004, and a video input terminal 2005. The charge pump of the invention can be applied to a power supply circuit of the display portion 2003, leading to lower power consumption. As a result, the battery life increases and the display device can operate for a long time. A liquid crystal display device or a light emitting device can be used for the display device, and the display device includes all the information display devices such as used for personal computer, TV broadcast receiving, or advertisement display.

Figure 15B:
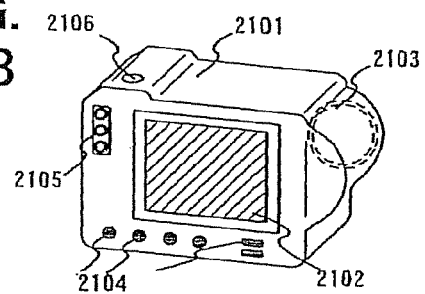

FIG. 15B shows a digital still camera (a digital camera) that includes a main body 2101, a display portion 2102, an image receiving portion 2103, operating keys 2104, an external connecting port 2105, and a shutter 2106. The charge pump of the invention can be applied to a power supply circuit of the display portion 2102, leading to lower power consumption. As a result, the battery life increases and the digital still camera can operate for a long time.

Figure 15C:
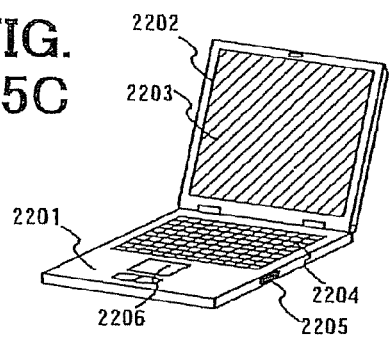

FIG. 15C shows a notebook computer that includes a main body 2201, a housing 2202, a display portion 2203, a keyboard 2204, an external connecting port 2205, and a pointing mouse 2206. The charge pump of the invention can be applied to a power supply circuit of the display portion 2203, leading to lower power consumption. As a result, the battery life increases and the notebook computer can operate for a long time.

Figure 15D:
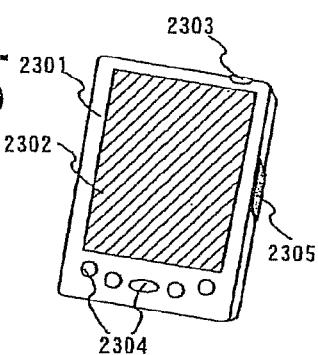

FIG. 15D shows a mobile computer that includes a main body 2301, a display portion 2302, a switch 2303, operating keys 2304, and an infrared port 2305. The charge pump of the invention can be applied to a power supply circuit of the display portion 2302, leading to lower power consumption. As a result, the battery life increases and the mobile computer can operate for a long time.

Figure 15E:
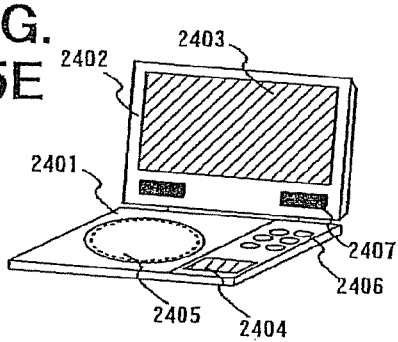

FIG. 15E shows a portable image reproducing device provided with a recording medium (specifically, a DVD reproducing device), that includes a main body 2401, a housing 2402, a display portion A 2403, a display portion B 2404, a recording medium (such as DVD) reading portion 2405, an operating key 2406, and a speaker portion 2407. The display portion A 2403 mainly displays image data while the display portion B 2404 mainly displays character data. The charge pump of the invention can be applied to a power supply circuit of the display portion A 2403 and the display portion B 2404, leading to lower power consumption. As a result, the battery life increases and the image reproducing device can operate for a long time. The image reproducing device equipped with a recording medium includes a home game machine and the like.

Figure 15F:
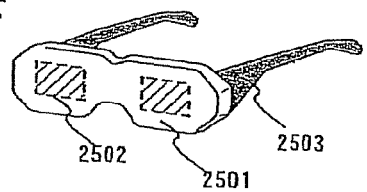

FIG. 15F shows a goggle type display (head mounted display) that includes a main body 2501, a display portion 2502, and an arm portion 2503. The charge pump of the invention can be applied to a power supply circuit of the display portion 2502, leading to lower power consumption. As a result, the battery life increases and the head mounted display can operate for a long time.

Figure 15G:
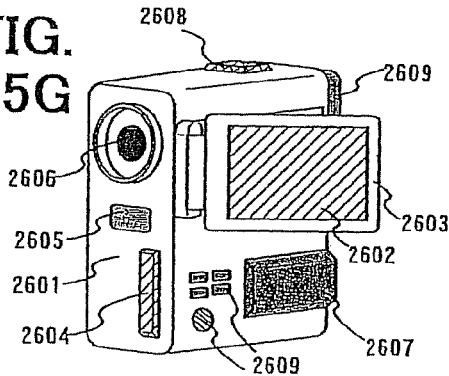

FIG. 15G shows a video camera that includes a main, body 2601, a display portion 2602, a housing 2603, an external connecting port 2604, a remote control receiving portion 2605, an image receiving portion 2606, a battery 2607, an audio input portion 2608, and operating keys 2609. The charge pump of the invention can be applied to a power supply circuit of the display portion 2602, leading to lower power consumption. As a result, the battery life increases and the video camera can operate for a long time.

Figure 15H:
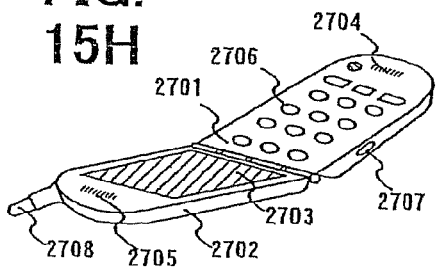

FIG. 15H shows a mobile phone that includes a main body 2701, a housing 2702, a display portion 2703, an audio input portion 2704, an audio output portion 2705, an operating key 2706, an external connecting port 2707, and an antenna 2708. The charge pump of the invention can be applied to a power supply circuit of the display portion 2703, leading to lower power consumption. As a result, the battery life increases and the mobile phone can operate for a long time. The mobile phone consumes less power if the display portion 2703 displays white characters on the black background.

As set forth above, the charge pump of the invention can be applied to various electronic apparatuses.

This application is based on Japanese Patent Application serial no. 2004-080124 filed in Japan Patent Office on Mar. 19, 2004, the contents of which are hereby incorporated by reference.

What is claimed is:

1. A semiconductor device comprising:
   a first transistor;
   a second transistor;
   a third transistor;
   a fourth transistor;
   a first capacitor;
   a second capacitor; and
   a third capacitor,
   wherein one of source or drain of the first transistor is electrically connected to a first wiring,
   wherein the other of source or drain of the first transistor is electrically connected to a first terminal of the second capacitor,
   wherein a gate of the first transistor is electrically connected to a first terminal of the first capacitor,
   wherein one of source or drain of the second transistor is electrically connected to the first terminal of the first capacitor,
   wherein the other of source or drain of the second transistor is electrically connected to the first terminal of the second capacitor,
   wherein a gate of the second transistor is electrically connected to a second terminal of the second capacitor,
   wherein one of source or drain of the third transistor is electrically connected to a first terminal of the third capacitor,
   wherein the other of source or drain of the third transistor is electrically connected to the first terminal of the second capacitor,
   wherein a gate of the third transistor is electrically connected to the second terminal of the second capacitor,
   wherein one of source or drain of the fourth transistor is electrically connected to a second wiring,
   wherein the other of source or drain of the fourth transistor is electrically connected to the first terminal of the second capacitor,
   wherein a gate of the fourth transistor is electrically connected to the first terminal of the third capacitor,
   wherein a second terminal of the first capacitor is electrically connected to the second terminal of the third capacitor, and
   wherein the fourth transistor has one of N-type conductivity or P-type conductivity, and the first transistor and the second transistor has the other of N-type conductivity or P-type conductivity.

2. The semiconductor device according to claim 1, wherein the first wiring is a power supply line.

3. A display device comprising the semiconductor device according to claim 1, wherein a pixel and the semiconductor device are provided over a substrate.

4. An electric apparatus comprising the display device according to claim 3, wherein the electric apparatus includes an operation key, an antenna, a battery, an audio input portion or an audio output portion.

5. A semiconductor device comprising a DC-DC converter, the DC-DC converter comprising:
a first transistor;
a second transistor;
a third transistor;
a fourth transistor;
a first capacitor;
a second capacitor; and
a third capacitor,
wherein one of source or drain of the first transistor is electrically connected to a first wiring,
wherein the other of source or drain of the first transistor is electrically connected to a first terminal of the second capacitor,
wherein a gate of the first transistor is electrically connected to a first terminal of the first capacitor,
wherein one of source or drain of the second transistor is electrically connected to the first terminal of the first capacitor,
wherein the other of source or drain of the second transistor is electrically connected to the first terminal of the second capacitor,
wherein a gate of the second transistor is electrically connected to a second terminal of the second capacitor,
wherein one of source or drain of the third transistor is electrically connected to a first terminal of the third capacitor,
wherein the other of source or drain of the third transistor is electrically connected to the first terminal of the second capacitor,
wherein a gate of the third transistor is electrically connected to the second terminal of the second capacitor,
wherein one of source or drain of the fourth transistor is electrically connected to a second wiring,
wherein the other of source or drain of the fourth transistor is electrically connected to the first terminal of the second capacitor,
wherein a gate of the fourth transistor is electrically connected to the first terminal of the third capacitor,
wherein a second terminal of the first capacitor is electrically connected to the second terminal of the third capacitor, and
wherein the fourth transistor has one of N-type conductivity or P-type conductivity, and the first transistor and the second transistor has the other of N-type conductivity or P-type conductivity.

6. The semiconductor device according to claim 5, wherein the first wiring is a power supply line.

7. A display device comprising the semiconductor device according to claim 5, wherein a pixel and the semiconductor device are provided over a substrate.

8. An electric apparatus comprising the display device according to claim 7, wherein the electric apparatus includes an operation key, an antenna, a battery, an audio input portion or an audio output portion.

9. A semiconductor device comprising:
a first transistor;
a second transistor;
a third transistor;
a fourth transistor;
a first capacitor;
a second capacitor;
a third capacitor; and
an inverter circuit,
wherein one of source or drain of the first transistor is electrically connected to a first wiring,
wherein the other of source or drain of the first transistor is electrically connected to a first terminal of the second capacitor,
wherein a gate of the first transistor is electrically connected to a first terminal of the first capacitor,
wherein one of source or drain of the second transistor is electrically connected to the first terminal of the first capacitor,
wherein the other of source or drain of the second transistor is electrically connected to the first terminal of the second capacitor,
wherein a gate of the second transistor is electrically connected to a second terminal of the second capacitor,
wherein one of source or drain of the third transistor is electrically connected to a first terminal of the third capacitor,
wherein the other of source or drain of the third transistor is electrically connected to the first terminal of the second capacitor,
wherein a gate of the third transistor is electrically connected to the second terminal of the second capacitor,
wherein one of source or drain of the fourth transistor is electrically connected to a second wiring,
wherein the other of source or drain of the fourth transistor is electrically connected to the first terminal of the second capacitor,
wherein a gate of the fourth transistor is electrically connected to the first terminal of the third capacitor,
wherein a second terminal of the first capacitor is electrically connected to the second terminal of the third capacitor,
wherein the fourth transistor has one of N-type conductivity or P-type conductivity and the first transistor and the second transistor has the other of N-type conductivity or P-type conductivity, and
wherein an input terminal of the inverter circuit is electrically connected to the second terminal of the first capacitor.

10. The semiconductor device according to claim 9, wherein the first wiring is a power supply line.

11. A display device comprising the semiconductor device according to claim 9, wherein a pixel and the semiconductor device are provided over a substrate.

12. An electric apparatus comprising the display device according to claim 11, wherein the electric apparatus includes an operation key, an antenna, a battery, an audio input portion or an audio output portion.

13. A semiconductor device comprising a DC-DC converter, the DC-DC converter comprising:
a first transistor;
a second transistor;
a third transistor;
a fourth transistor;
a first capacitor;
a second capacitor;
a third capacitor; and
an inverter circuit,
wherein one of source or drain of the first transistor is electrically connected to a first wiring, wherein the other of source or drain of the first transistor is electrically connected to a first terminal of the second capacitor, wherein a gate of the first transistor is electrically connected to a first terminal of the first capacitor, wherein one of source or drain of the second transistor is electrically connected to the first terminal of the first capacitor, wherein the other of source or drain of the second transistor is electrically connected to the first terminal of the second capacitor, wherein a gate of the second transistor is electrically connected to a second terminal of the second capacitor, wherein one of source or drain of the third transistor is electrically connected to a first terminal of the third capacitor, wherein the other of source or drain of the third transistor is electrically connected to the first terminal of the second capacitor, wherein a gate of the third transistor is electrically connected to the second terminal of the second capacitor, wherein one of source or drain of the fourth transistor is electrically connected to a second wiring, wherein the other of source or drain of the fourth transistor is electrically connected to the first terminal of the second capacitor, wherein a gate of the fourth transistor is electrically connected to the first terminal of the third capacitor, wherein a second terminal of the first capacitor is electrically connected to the second terminal of the third capacitor, wherein the fourth transistor has one of N-type conductivity or P-type conductivity, and the first transistor and the second transistor has the other of N-type conductivity or P-type conductivity, and wherein an input terminal of the inverter circuit is electrically connected to the second terminal of the first capacitor.

14. The semiconductor device according to claim 13, wherein the first wiring is a power supply line.

15. A display device comprising the semiconductor device according to claim 13, wherein a pixel and the semiconductor device are provided over a substrate.

16. An electric apparatus comprising the display device according to claim 15, wherein the electric apparatus includes an operation key, an antenna, a battery, an audio input portion or an audio output portion.

* * * * *

UNITED STATES PATENT AND TRADEMARK OFFICE
CERTIFICATE OF CORRECTION

PATENT NO. : 8,482,341 B2  
APPLICATION NO. : 13/469713  
DATED : July 9, 2013  
INVENTOR(S) : Hajime Kimura Page 1 of 1

It is certified that error appears in the above-identified patent and that said Letters Patent is hereby corrected as shown below:

In the Specification:

Column 1, line 28; Change "pimp" to --pump--.
Column 3, line 66; Change "has. P-type" to --has P-type--.
Column 15, line 63; Change "faulted" to --formed--.
Column 16, line 7; Change "pimp" to --pump--.
Column 18, line 49; Change "pimp" to --pump--.
Column 18, line 64; Change "display play device," to --display device,--.
Column 25, line 56; Change "pimp" to --pump--.
Column 27, line 43; Change "pimp" to --pump--.
Column 32, line 29; Change "D2FIG.13." to --D2 in FIG. 13.--.
Column 33, line 16; Change "can, be" to --can be--.
Column 33, line 66; Change "pimp" to --pump--.
Column 34, line 8; Change "pimp," to --pump,--.
Column 34, line 19; Change "pimp" to --pump--.
Column 37, line 61; Change "main, body" to --main body--.

Signed and Sealed this  
First Day of April, 2014

Michelle K. Lee  
*Deputy Director of the United States Patent and Trademark Office*